United States Patent
Boniardi et al.

(10) Patent No.: US 10,559,353 B2
(45) Date of Patent: Feb. 11, 2020

(54) WEIGHT STORAGE USING MEMORY DEVICE

(71) Applicant: Micron Technology, Inc., Boise, ID (US)

(72) Inventors: Mattia Boniardi, Cormano (IT); Innocenzo Tortorelli, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/001,790

(22) Filed: Jun. 6, 2018

(65) Prior Publication Data

US 2019/0378566 A1 Dec. 12, 2019

(51) Int. Cl.
| | |
|---|---|
| *G11C 13/00* | (2006.01) |
| *G11C 11/54* | (2006.01) |
| *G11C 11/56* | (2006.01) |
| *H01L 45/00* | (2006.01) |
| *G06N 3/04* | (2006.01) |

(52) U.S. Cl.
CPC .......... *G11C 11/54* (2013.01); *G11C 11/5678* (2013.01); *G11C 13/0004* (2013.01); *G11C 13/0069* (2013.01); *H01L 45/06* (2013.01); *H01L 45/141* (2013.01); *G06N 3/04* (2013.01); *G11C 2013/0078* (2013.01); *G11C 2213/30* (2013.01)

(58) Field of Classification Search
CPC . G11C 11/54; G11C 11/5678; G11C 13/0069; G11C 13/0004; G11C 2213/30; G11C 2013/0078; H01L 45/06; H01L 45/141; G06N 3/04
See application file for complete search history.

(56) References Cited

U.S. PATENT DOCUMENTS

| | | |
|---|---|---|
| 2009/0228761 A1 | 9/2009 | Perlmutter et al. |
| 2010/0265764 A1 | 10/2010 | Yoo et al. |
| 2011/0007563 A1 | 1/2011 | Yoo et al. |
| 2012/0084241 A1 | 4/2012 | Friedman et al. |

(Continued)

OTHER PUBLICATIONS

International Search Report and Written Opinion of the International Application No. PCT/US2019/032437, dated Aug. 29, 2019, 11 pages.

*Primary Examiner* — Sultana Begum
(74) *Attorney, Agent, or Firm* — Holland & Hart LLP

(57) ABSTRACT

Methods, systems, and devices for mimicking neuro-biological architectures that may be present in a nervous system are described herein. A memory device may include a memory unit configured to store a value. A memory unit may include a first memory cell (e.g., an aggressor memory cell) and a plurality of other memory cells (e.g., victim memory cells). The memory unit may use thermal disturbances of the victim memory cells that may be based on an access operation to store the analog value. Thermal energy output by the aggressor memory cell during an access operation (e.g., a write operation) may cause the state of the victim memory cells to alter based on thermal relationship between the aggressor memory cell and at least some of the victim memory cells. The memory unit may be read by detecting and combining the weights of the victim memory cells during a read operation.

14 Claims, 11 Drawing Sheets

(56) References Cited

U.S. PATENT DOCUMENTS

| | | | |
|---|---|---|---|
| 2012/0096234 A1* | 4/2012 | Jiang | G11C 11/5678 |
| | | | 711/170 |
| 2014/0078823 A1* | 3/2014 | Kruglick | G11C 7/04 |
| | | | 365/163 |
| 2014/0219027 A1* | 8/2014 | Dong | G11C 16/3427 |
| | | | 365/185.17 |
| 2018/0075341 A1* | 3/2018 | Dasgupta | G06N 3/0445 |
| 2018/0095930 A1 | 4/2018 | Lu et al. | |
| 2019/0026629 A1* | 1/2019 | Busch | G06F 8/65 |

* cited by examiner

WEIGHT STORAGE USING MEMORY DEVICE

BACKGROUND

The following relates generally to memory devices and more specifically to weight storage using a memory device.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory cells may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics.

DETAILED DESCRIPTION

In neural networks a synaptic weight may refer to the strength or amplitude of a connection between two nodes (e.g., a neuron). The nature and content of information transmitted through a neural network may be based in part on the properties of synapses formed between the nodes (e.g., synaptic weight). Neuromorphic systems and devices, among others, may be designed to achieve results that may not be possible with traditional computer-architectures. For example, neuromorphic systems may be used to achieve results more commonly associated with biological systems such as learning, vision or visual processing, auditory processing, advanced computing, or other processes, or a combination thereof.

Systems, devices, and methods configured to mimic neuro-biological architectures that may be present in a nervous system and/or to store synaptic weight are described herein. A memory device may include at least one memory unit configured to store a value, such as an analog value. The memory unit may include a first memory cell (e.g., an aggressor memory cell) and a plurality of other memory cells (e.g., victim memory cells). The memory unit and/or related components may use thermal disturbances of the victim memory cells that may be caused by the aggressor memory cell during an access operation (e.g., a write operation) to store a value (e.g., an analog value). The thermal energy output by the aggressor memory cell during the write operation may cause the state of the victim memory cells to alter based on a thermal relationship between the aggressor memory cell and at least one of, if not each of, the victim memory cells. The memory unit may, in some cases, be read by detecting and combining the weights of the victim memory cells during a read operation.

Features of the disclosure introduced above are further described below in the context of a memory device in FIGS. 1-2. Specific examples are then described for a neural memory unit of a memory device in FIGS. 3-11. These and other features of the disclosure are further illustrated by and described with reference to apparatus diagrams, system diagrams, and flowcharts that relate to weight storage using a memory device.

Figure 1:
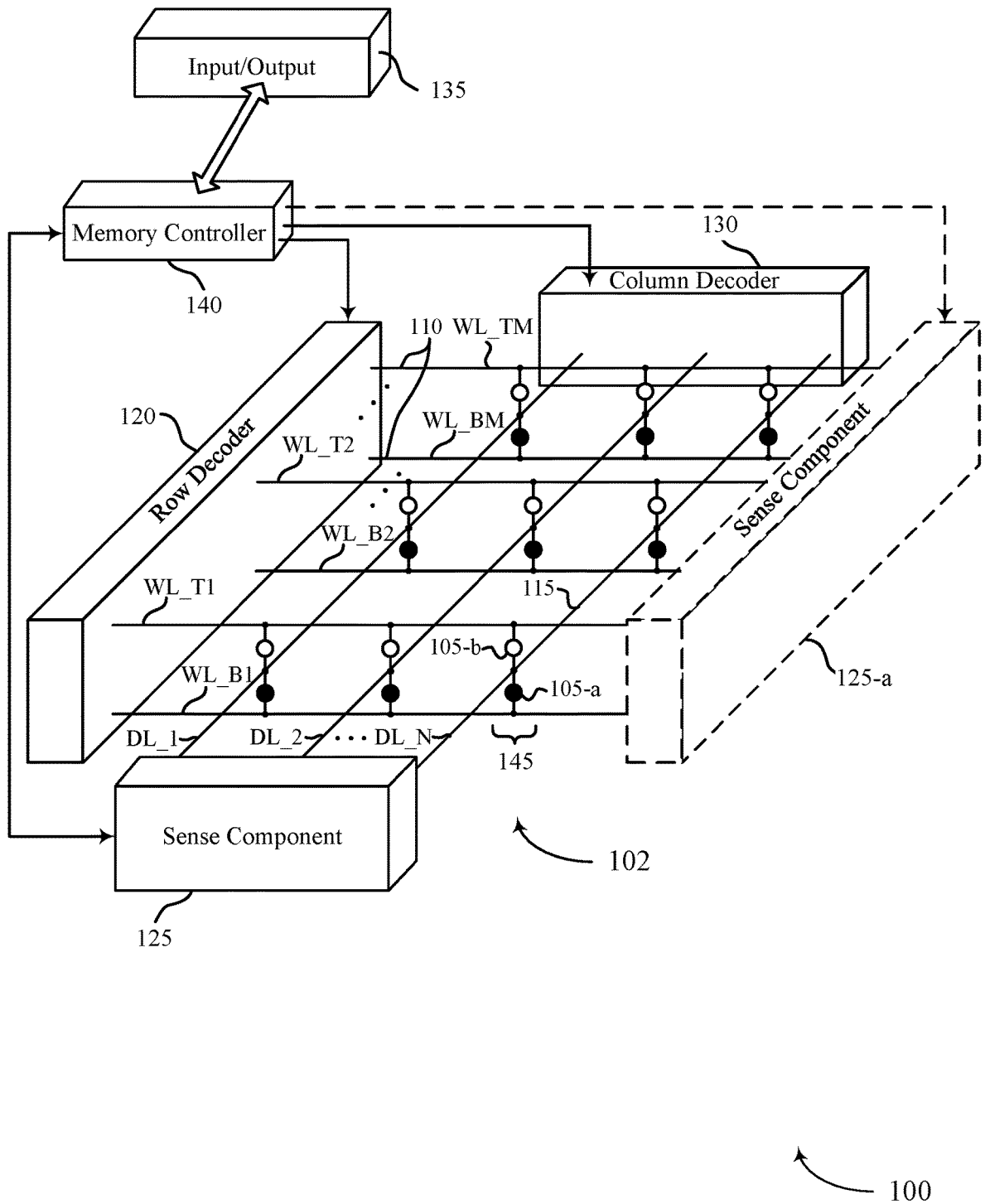
FIG. 1 illustrates an exemplary diagram of a memory device including a three-dimensional array of memory cells that supports weight storage using a memory device in accordance with embodiments of the present disclosure.

FIG. 1 illustrates an example of a memory device 100 that supports weight storage using a memory device in accordance with various embodiments of the present disclosure. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, not their actual physical positions within the memory device 100. In the illustrative example of FIG. 1, the memory device 100 includes a three-dimensional (3D) memory array 102. The 3D memory array 102 includes memory cells 105 that may be programmable to store different states. In some embodiments, each memory cell 105 may be programmable to store two states, denoted as a logic 0 and a logic 1. In some embodiments, a memory cell 105 may be configured to store more than two logic states. A memory cell 105 may, in some embodiments, include a self-selecting memory cell. It is to be understood that the memory cell 105 may also include a memory cell of another type—e.g., a 3D XPoint™ memory cell, a PCM cell that includes a storage component and a selection component, a CBRAM cell, or a FeRAM cell. Although some elements included in FIG. 1 are labeled with a numeric indicator, other corresponding elements are not labeled, though they are the same or would be understood to be similar, in an effort to increase the visibility and clarity of the depicted features.

The 3D memory array 102 may include two or more two-dimensional (2D) memory arrays formed on top of one another. This may increase a number of memory cells that may be placed or created on a single die or substrate as compared with a single 2D array, which in turn may reduce production costs, or increase the performance of the memory device, or both. In the example depicted in FIG. 1, memory array 102 includes two levels of memory cells 105 (e.g., memory cell 105-a and memory cell 105-b) and may thus be considered a 3D memory array; however, the number of levels may not be limited to two, and other examples may include additional levels. Each level may be aligned or positioned so that memory cells 105 may be aligned (exactly, overlapping, or approximately) with one another across each level, thus forming memory cell stacks 145.

In some embodiments, each row of memory cells 105 is connected to a word line 110, and each column of memory cells 105 is connected to a digit line 115 (sometimes referred to as a bit line). Both word lines 110 and digit lines 115 may also be generically referred to as access lines. Further, an access line may function as a word line 110 for one or more memory cells 105 at one deck of the memory device 100 (e.g., for memory cells 105 below the access line) and as a digit line 115 for one or more memory cells 105 at another deck of the memory device (e.g., for memory cells 105 above the access line). Thus, references to word lines and digit lines, or their analogues, are interchangeable without loss of understanding or operation. Word lines 110 and digit lines 115 may be substantially perpendicular to one another and may support an array of memory cells.

In general, one memory cell 105 may be located at the intersection of two access lines such as a word line 110 and a digit line 115. This intersection may be referred to as the address of the memory cell 105. A target memory cell 105 may be a memory cell 105 located at the intersection of an energized (e.g., activated) word line 110 and an energized (e.g., activated) digit line 115; that is, a word line 110 and a digit line 115 may both be energized in order to read or write a memory cell 105 at their intersection. Other memory cells 105 that are in electronic communication with (e.g., connected to) the same word line 110 or digit line 115 may be referred to as untargeted memory cells 105.

As shown in FIG. 1, the two memory cells 105 in a memory cell stack 145 may share a common conductive line such as a digit line 115. That is, a digit line 115 may be coupled with the upper memory cell 105-b and the lower memory cell 105-a. Other configurations may be possible, for example, a third layer (not shown) may share a word line 110 with the upper memory cell 105-b.

In some cases, an electrode may couple a memory cell 105 to a word line 110 or a digit line 115. The term electrode may refer to an electrical conductor, and may include a trace, wire, conductive line, conductive layer, or the like that provides a conductive path between elements or components of memory device 100. Thus, the term electrode may refer in some cases to an access line, such as a word line 110 or a digit line 115, as well as in some cases to an additional conductive element employed as an electrical contact between an access line and a memory cell 105. In some embodiments, a memory cell 105 may comprise a chalcogenide material positioned between a first electrode and a second electrode. The first electrode may couple the chalcogenide material to a word line 110, and the second electrode couple the chalcogenide material to a digit line 115. The first electrode and the second electrode may be the same material (e.g., carbon) or different material. In other embodiments, a memory cell 105 may be coupled directly with one or more access lines, and electrodes other than the access lines may be omitted.

Operations such as reading and writing may be performed on memory cells 105 by activating or selecting word line 110 and digit line 115. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the logic storing device of a cell (e.g., a resistive component in a CBRAM cell, a capacitive component in a FeRAM cell) may be electrically isolated from the digit line by a selection component. The word line 110 may be connected to and may control the selection component. For example, the selection component may be a transistor and the word line 110 may be connected to the gate of the transistor. Alternatively, the selection component may be a variable resistance component, which may comprise chalcogenide material. Activating the word line 110 may result in an electrical connection or closed circuit between the logic storing device of the memory cell 105 and its corresponding digit line 115. The digit line may then be accessed to either read or write the memory cell 105. Upon selecting a memory cell 105, the resulting signal may be used to determine the stored logic state. In some cases, a first logic state may correspond to no current or a negligibly small current through the memory cell 105, whereas a second logic state may correspond to a finite current.

In some cases, a memory cell 105 may include a self-selecting memory cell having two terminals and a separate selection component may be omitted. As such, one terminal of the self-selecting memory cell may be electrically connected to a word line 110 and the other terminal of the self-selecting memory cell may be electrically connected to a digit line 115.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate digit line 115. For example, memory array 102 may include multiple word lines 110, labeled WL_T1 through WL_TM and WL_B1 through WL_BM, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and digit line 115) and the presence of a resulting current through the memory cell 105 may depend on the applied voltage and the threshold voltage of the memory cell 105. In some cases, more than one voltage may be applied.

Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

In some cases, the memory cell 105 (e.g., a phase change memory cell or a self-selecting memory cell) may comprise a chalcogenide material. The chalcogenide material of the memory cell may remain in an amorphous state during the access operation. In some cases, operating the memory cell may include applying various shapes of programming pulses to the memory cell to determine a particular threshold voltage of the memory cell—that is, a threshold voltage of a memory cell may be modified by changing a shape of a programming pulse, which may alter a local composition of the chalcogenide material in the memory cell.

A particular threshold voltage of the memory cell may be determined by applying various shapes of read pulses to the memory cell. For example, when an applied voltage of a read pulse exceeds the particular threshold voltage of the memory cell, a finite amount of current may flow through the memory cell. Similarly, when the applied voltage of a read pulse is less than the particular threshold voltage of the memory cell, no appreciable amount of current may flow through the memory cell. In some embodiments, sense component 125 may read information stored in a selected memory cell 105 by detecting the current flow or lack thereof through the memory cell 105. In this manner, the memory cell 105 (e.g., a phase change memory cell or a self-selecting memory cell) may store one bit of data based on threshold voltage levels (e.g., two threshold voltage levels) associated with the chalcogenide material, with the threshold voltage levels at which current flows through the memory cell 105 indicative of a logic state stored by the memory cell 105. In some cases, the memory cell 105 may exhibit a certain number of different threshold voltage levels (e.g., three or more threshold voltage levels), thereby storing more than one bit of data.

Sense component 125 may include various transistors or amplifiers in order to detect and amplify a difference in the signals associated with a sensed memory cell 105, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. FIG. 1 also shows an alternative option of arranging the sense component 125-a (in a dashed box). An ordinary person skilled in the art would appreciate that sense component 125 may be associated either with column decoder or row decoder without losing its functional purposes.

A memory cell 105 may be set or written by similarly activating the relevant word line 110 and digit line 115, and at least one logic value may be stored in the memory cell 105. Column decoder 130 or row decoder 120 may accept data, for example input/output 135, to be written to the memory cells 105.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state, so the logic state may be re-written after a sense operation. Additionally, in some memory architectures, activating a single word line 110 may result in the discharge of all memory cells in the row (e.g., coupled with the word line 110); thus, several or all memory cells 105 in the row may need to be re-written. But in non-volatile memory, such as self-selecting memory, PCM, CBRAM, FeRAM, or NAND memory, accessing the memory cell 105 may not destroy the logic state and, thus, the memory cell 105 may not require re-writing after accessing.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory device 100. In general, the amplitude, shape, polarity, and/or duration of an applied voltage or current discussed herein may be adjusted or varied and may be different for the various operations discussed in operating the memory device 100. Furthermore, one, multiple, or all memory cells 105 within memory array 102 may be accessed simultaneously; for example, multiple or all cells of memory array 102 may be accessed simultaneously during a reset operation in which all memory cells 105, or a group of memory cells 105, are set to a single logic state.

Various memory cells 105 of the memory device 100 may be grouped into memory units that are configured to store an analog value. The memory units may be configured to mimic neuro-biological architectures. The memory units may leverage properties of chalcogenide memory and thermal disturbances to store the analog value, as one example value. A memory unit may, in some cases, include a first memory cell (e.g., an aggressor memory cell) and at least one other memory cell (e.g., a victim memory cell) positioned on a different access line (e.g., a word line and/or a digit line). The thermal energy output by the aggressor memory cell during an operation (e.g., a write operation) may change the state of the victim memory cells based on a thermal relationship between the aggressor memory cell and the at least one victim memory cell.

Figure 2:
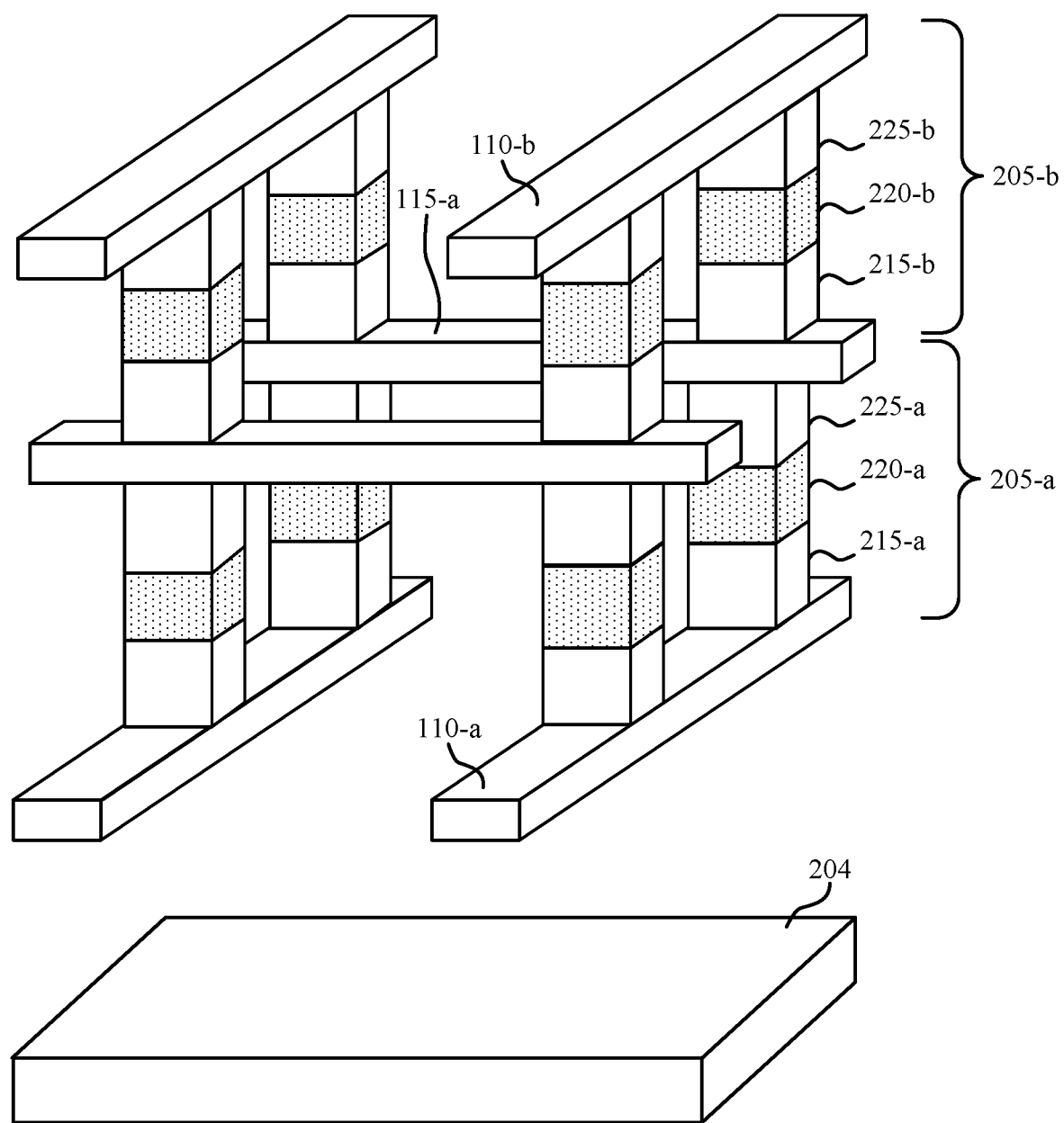
FIG. 2 illustrates an example of a three-dimensional memory array that supports weight storage using a memory device in accordance with embodiments of the present disclosure.

FIG. 2 illustrates an example of a 3D memory array 200 that supports weight storage using a memory device in accordance with various embodiments of the present disclosure. Memory array 200 may be an example of portions of memory array 102 described with reference to FIG. 1. Memory array 200 may include a first array or deck 205-a of memory cells that is positioned above a substrate 204 and a second array or deck 205-b of memory cells on top of the first array or deck 205-a. Memory array 200 may also include word line 110-a and word line 110-b, and digit line 115-a, which may be examples of word lines 110 and a digit line 115, as described with reference to FIG. 1. As in the illustrative example depicted in FIG. 2, memory cells of the first deck 205-a and the second deck 205-b may each include a self-selecting memory cell. In some examples, memory cells of the first deck 205-*a* and the second deck 205-*b* may each include another type of memory cell that may be suitable for a cross-point architecture—e.g., a CBRAM cell or an FeRAM cell. Although some elements included in FIG. 2 are labeled with a numeric indicator, other corresponding elements are not labeled, though they are the same or would be understood to be similar, in an effort to increase the visibility and clarity of the depicted features.

In some cases, self-selecting memory cells of the first deck 205-*a* may each include first electrode 215-*a*, chalcogenide material 220-*a*, and second electrode 225-*a*. In addition, self-selecting memory cells of the second deck 205-*b* may each include first electrode 215-*b*, chalcogenide material 220-*b*, and second electrode 225-*b*. In some embodiments, access lines (e.g., word line 110, digit line 115) may include an electrode layer (e.g., a conformal layer), in lieu of electrodes 215 or 225 and thus may comprise multi-layered access lines. In such embodiments, the electrode layer of the access lines may interface with a memory material (e.g., chalcogenide material 220). In some embodiments, access lines (e.g., word line 110, digit line 115) may directly interface with a memory material (e.g., chalcogenide material 220) without an electrode layer or an electrode in-between.

The self-selecting memory cells of the first deck 205-*a* and second deck 205-*b* may, in some embodiments, have common conductive lines such that corresponding (e.g., vertically aligned in y-direction) self-selecting memory cells of each deck 205-*a* and 205-*b* may share digit lines 115 or word lines 110 as described with reference to FIG. 1. For example, first electrode 215-*b* of the second deck 205-*b* and second electrode 225-*a* of the first deck 205-*a* may both be coupled to digit line 115-*a* such that digit line 115-*a* is shared by vertically aligned and adjacent self-selecting memory cells (in y-direction).

In some embodiments, memory array 200 may include an additional digit line (not shown) such that the first electrode 215-*b* of the second deck 205-*b* may be coupled with the additional digit line and the second electrode 225-*a* of the first deck 205-*a* may be coupled with the digit line 115-*a*. The additional digit line may be electrically isolated from the digit line 115-*a* (e.g., an insulating material may be interposed between the additional digit line and the digit line 115-*a*). As a result, the first deck 205-*a* and the second deck 205-*b* may be separated and may operate independently of each other. In some cases, an access line (e.g., either word line 110 or digit line 115) may include a selection component (e.g., a two-terminal selector device, which may be configured as one or more thin-film materials integrated with the access line) for a respective memory cell at each cross-point. As such, the access line and the selection component may together form a composite layer of materials functioning as both an access line and a selection component.

The architecture of memory array 200 may in some cases be referred to as an example of a cross-point architecture, as a memory cell may be formed at a topological cross-point between a word line 110 and a digit line 115 as illustrated in FIG. 2. Such a cross-point architecture may offer relatively high-density data storage with lower production costs compared to some other memory architectures. For example, a memory array with a cross-point architecture may have memory cells with a reduced area and, resultantly, may support an increased memory cell density compared to some other architectures. For example, a cross-point architecture may have a $4F^2$ memory cell area, where F is the smallest feature size (e.g., a minimum feature size), compared to other architectures with a $6F^2$ memory cell area, such as those with a three-terminal selection component. For example, a DRAM memory array may use a transistor, which is a three-terminal device, as the selection component for each memory cell, and thus a DRAM memory array comprising a given number of memory cells may have a larger memory cell area compared to a memory array with a cross-point architecture comprising the same number of memory cells.

While the example of FIG. 2 shows two memory decks, other configurations may include any number of decks. In some embodiments, one or more of the memory decks may include self-selecting memory cells that include chalcogenide material 220. In other embodiments, one or more of the memory decks may include FeRAM cells that include a ferroelectric material. In yet another embodiments, one or more of the memory decks may include CBRAM cells that include a metallic oxide or a chalcogenide material. Chalcogenide materials 220 may, for example, include a chalcogenide glass such as, for example, an alloy of selenium (Se), tellurium (Te), arsenic (As), antimony (Sb), carbon (C), germanium (Ge), and silicon (Si). In some embodiment, a chalcogenide material having primarily selenium (Se), arsenic (As), and germanium (Ge) may be referred to as SAG-alloy.

Memory cells may be incorporated as part of memory units that may be configured to store values, which may in some cases be or include analog values. In some memory devices, applying an electronic pulse to a chalcogenide material 220-*a* may cause the chalcogenide material 220-*a* to be affected, which may in some cases include changing physical form. The physical forms for some chalcogenide materials 220-*a* include an amorphous state and a crystalline state. The resistance of these physical forms is different, thereby allowing the chalcogenide material 220-*a* to store logic (e.g., digital logic). In some chalcogenide memory systems, to cause the chalcogenide material 220-*a* to be in an amorphous state, a controller may heat the chalcogenide material 220-*a* with an electrical pulse and rapidly cool the chalcogenide material 220-*a* by removing the pulse. The rapid cooling may cause the structure of the chalcogenide material 220-*a* to be less ordered and therefore more resistive. In some PCM systems, to cause the chalcogenide material 220-*a* to be in a crystalline state, a controller may heat the chalcogenide material 220-*a* with an electrical pulse and slowly cool the chalcogenide material 220-*a* by ramping down the electrical pulse. The slow cooling may provide time for the structure of the chalcogenide material 220-*a* to become more ordered and therefore less resistive. Memory units of the memory device may use these properties of chalcogenide materials store analog values in a memory unit that comprises a plurality of memory cells. Each memory unit may include a plurality of memory cells 105-*a* that include the chalcogenide material 220-*a*.

Figure 3:
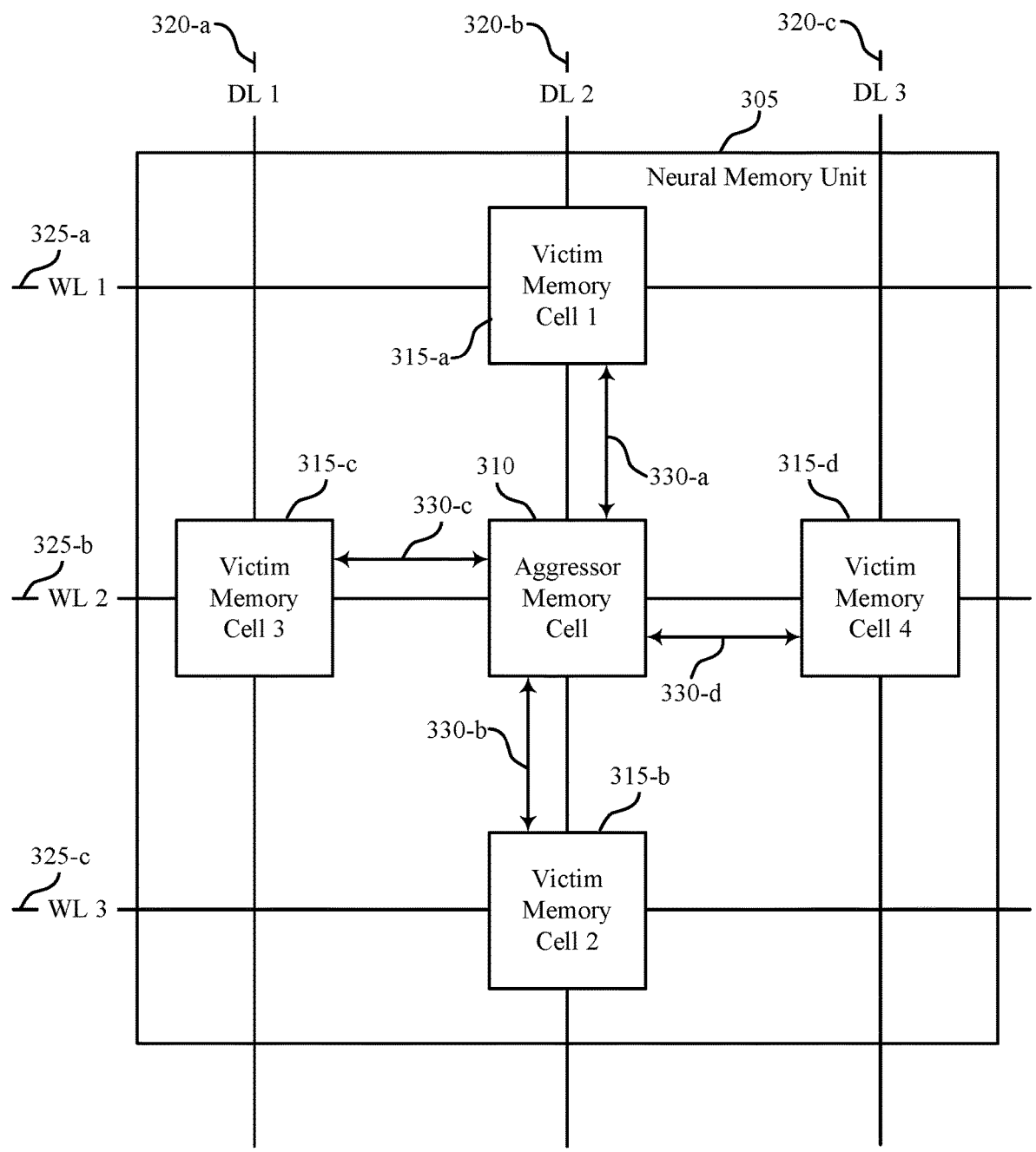
FIG. 3 illustrates an example of a memory array that supports weight storage using a memory device in accordance with embodiments of the present disclosure.

FIG. 3 illustrates an example of a memory array 300 that supports weight storage using a memory device in accordance with various embodiments of the present disclosure. The memory array 300 may be an example of a portion of the memory device 100 described with reference to FIGS. 1 and 2. The memory array 300 may include a neural memory unit 305 configured to store a value or weight (e.g., an analog value or analog weight). The neural memory unit 305 may be configured to mimic neuro-biological architectures that may be present in a nervous system and/or to store one or more synaptic weights. As such, the neural memory unit 305 may be an example of a neuromorphic system and/or a portion of a neural network.

Some neuromorphic systems may use resistive RAM (RRAM) such as PCM devices or self-selecting memory devices to store a value (or weight) of a synapse. Such resistive memory may include memory cells configured to store multiple levels and/or that may have wide sense windows. Such types of memory may be configured to perform training operations by pulse (e.g., spike) control. Such training operations may include spike-timing-dependent plasticity (STDP). STDP may be form of Hebbian learning that is induced by correlation between spikes transmitted between nodes (e.g., neurons). STDP may be an example of a process that adjusts the strength of connections between nodes (e.g., neurons).

In neural networks the synaptic weight may refer to the strength or amplitude of a connection between two nodes. The nature and content of information transmitted through a neural network may be based in part on the properties of connections (e.g., synapses) formed between neurons (e.g., synaptic weight). Neuromorphic systems may be designed to achieve results that may not be possible with traditional computer-architectures. For example, neuromorphic systems may be used to achieve results more commonly associated with biological systems such as learning, vision or visual processing, auditory processing, advanced computing, or other processes, or a combination thereof.

The synaptic weight may, in some cases, be simulated as or otherwise relate to a resistance/threshold voltage of memory cells in a memory device (e.g., a resistive memory device, a memory device including chalcogenide). In some cases, the number of pulses delivered to a memory cell may correlate with the resistance or threshold voltage of the memory cell, such as a resistive memory cell or a memory cell including chalcogenide. In such cases, an analog resistance or threshold voltage of the memory cell may represent the synaptic weight in a neuromorphic system.

Some resistive memory technologies, however, may not feature a wide-enough sense window to store a large range of analog values that may represent a synaptic weight. For example, 3DXP memory cells may have a fast state transition and other features that may cause a threshold voltage readout that is more in a linear scale and thus may result in a limited learning capability for individual memory cell in a 3DXP memory array.

A memory device (e.g., a resistive memory device such as a 3DXP memory device) may include one or more neural memory units 305 that are configured to mimic a neurobiological architecture and store a value (e.g., an analog value) that may represent a synaptic weight. The neural memory unit 305 may include an aggressor memory cell 310 (e.g., a primary memory cell) and a plurality of victim memory cells 315 (e.g., secondary memory cells). The memory cells may be examples of the phase change memory cells, resistive memory cells, or memory cells that include a chalcogenide material. The victim memory cells 315 may be positioned adjacent to the aggressor memory cell 310 in an array of memory cells (e.g., the victim memory cells may not be separated from the aggressor memory cell along an access line by an intermediate memory cell). In some cases, the aggressor memory cell 310 and the plurality of victim memory cells 315 may be positioned in the same deck of memory cells. In some cases, the aggressor memory cell 310 and at least one of the plurality of victim memory cells may be positioned in different decks of memory cells.

The memory cells of the neural memory unit 305 may be coupled to a plurality of digit lines 320 (e.g., DL 1, DL 2, and DL 3) and a plurality of word lines 325 (e.g., WL 1, WL 2, and WL 3). The aggressor memory cell 310 may be coupled with a second digit line 320-$b$ (e.g., DL 2) and a second word line 325-$b$ (e.g., WL 2). Each of the victim memory cells 315 may be coupled with at least one of the second digit line 320-$b$ or the second word line 325-$b$. In some cases, each victim memory cell 315 shares one access line with the aggressor memory cell 310 and is coupled with one access line that is not coupled with the aggressor memory cell 310.

Each victim memory cell 315 may be have a thermal relationship 330 with aggressor memory cell 310. The thermal relationship 330 may define a thermal coupling between the victim memory cell 315 and the aggressor memory cell 310. For example, the stronger the thermal relationship 330 the greater amount of thermal energy that may be transferred between the two memory cells. In some cases, the thermal relationship 330 between the aggressor memory cell 310 and each victim memory cell 315 is different.

The neural memory unit 305 may use thermal disturbances of the victim memory cells 315 initiated by the aggressor memory cell 310 to store an analog value. For example, as a pulse is applied to the aggressor memory cell 310, each victim memory cell 315 may receive an amount of thermal energy based on the thermal relationship 330 between the specific victim memory cell 315 and the aggressor memory cell 310. In some cases, this thermal energy may be referred to as a thermal disturb. The threshold voltage of the victim memory cell 315 may change based on the amount of thermal energy received from the aggressor memory cell 310. The memory array 300 may be configured to use these thermal disturbance properties to store values, such as analog values, in the neural memory unit 305.

An example of the thermal coupling properties of the neural memory unit 305 is described. The first victim memory cell 315-$a$ may have a first thermal relationship 330-$a$ with the aggressor memory cell 310. The second victim memory cell 315-$b$ may have a second thermal relationship 330-$b$ with the aggressor memory cell 310. The third victim memory cell 315-$c$ may have a third thermal relationship 330-$c$ with the aggressor memory cell 310. The fourth victim memory cell 315-$d$ may have a fourth thermal relationship 330-$d$ with the aggressor memory cell 310. Each thermal relationship (330-$a$, 330-$b$, 330-$c$, 330-$d$) may be different (or in some cases as some of a plurality of thermal relationships may be different while at least some of the plurality of thermal relationships may be the same). During a write operation of the neural memory unit 305, a pulse may be applied to the aggressor memory cell 310. In response to applying the pulses to the aggressor memory cell 310, the threshold voltage of each victim memory cell 315 may erode at different rates based on the thermal relationship 330. The memory array 300 may be configured to store and/or read different analog values to and from the neural memory unit 305 based on the combination of threshold voltages of the victim memory cells 315. Details about the write operation of the neural memory unit 305 are described in more detail with reference to FIG. 5. Details about the read operation of the neural memory unit 305 are described in more detail with reference to FIG. 6.

Figure 4:
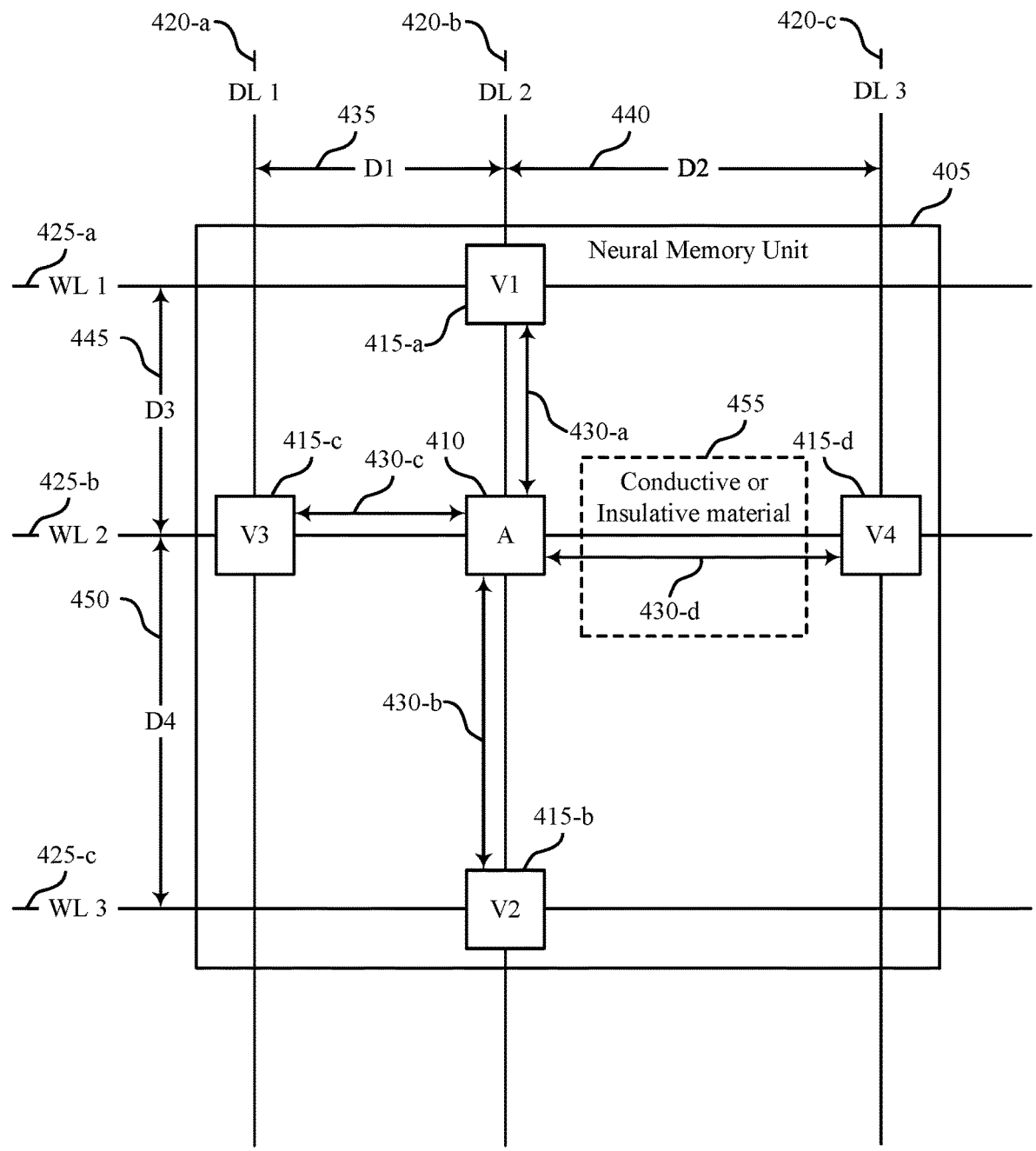
FIG. 4 illustrates an example of a thermal topology of a memory array that supports weight storage using a memory device in accordance with embodiments of the present disclosure.

The memory array 300 may include a plurality of neural memory units 305. In some cases, memory cells cannot be shared between different neural memory units 305. In some cases, neighboring neural memory units may include memory cells that are positioned diagonally from the aggressor memory cell 310 (e.g., a memory cell positioned at the intersection of the third digit line 320-$c$ and the third word line 325-$c$). In some cases, neighboring memory cells FIG. 4 illustrates an example of a thermal topology of a memory array 400 that supports weight storage using a memory device in accordance with various embodiments of the present disclosure. The memory array 400 exhibits different topologies of memory cells that may change the thermal relationships between memory cells.

The memory array 400 may be an example of the memory array 300 described with reference to FIG. 3. The memory array 400 may include a neural memory unit 405. The neural memory unit 405 may include an aggressor memory cell 410 and a plurality of victim memory cells 415. The memory cells of the neural memory unit 405 may be coupled to a plurality of digit lines 420 and a plurality of word lines 425. Each victim memory cell 415 may have a thermal relationship 430 with the aggressor memory cell 410. Each of these features may be examples of similar features described with reference to FIG. 3 and full descriptions of these features are not repeated here.

The thermal relationships 430 may be based on a variety of characteristics of the memory array 400. The thermal relationships 430 may be based at least in part on a physical distance between the aggressor memory cell 410 and a victim memory cell 415 (e.g., 415-a, 415-b, 415-c, and/or 415-d), a characteristic of a conductive material positioned between or coupled with the aggressor memory cell 410 and a victim memory cell 415 (e.g., 415-a, 415-b, 415-c, and/or 415-d), or a characteristic of an insulative material positioned between or coupled with the aggressor memory cell 410 and a victim memory cell 415 (e.g., 415-a, 415-b, 415-c, and/or 415-d), or a combination thereof.

The thermal topology of the memory array 400 illustrates an example where the thermal relationships 430 are affected by physical distances between memory cells (e.g., space imbalances between memory cells). The memory array 400 may be built such that a first distance 435 (e.g., D1) between the first digit line 420-a and the second digit line 420-b is smaller than a second distance 440 (e.g., D2) between the second digit line 420-b and the third digit line 420-c. Similarly, the memory array 400 may be built such that a third distance 445 (e.g., D3) between the first word line 425-a and the second word line 425-b is smaller than a fourth distance 450 (e.g., D4) between the second word line 425-b and the third word line 425-c. Such a topology of the memory array results in the first victim memory cell 415-a being in a closer physical proximity to the aggressor memory cell 410 than the second victim memory cell 415-b; and the third victim memory cell 415-c being in a closer physical proximity to the aggressor memory cell 410 than the fourth victim memory cell 415-d. This difference in physical distances between memory cells may, in some cases, result in different thermal relationships 430 between memory cells. Alternatively, although the physical distances between memory cells may be different the thermal relationships may be similar or the same based on other factors or structural differences of the connections between the memory cells.

In addition, the positioning of a conductive materials and/or insulative material 455 in the memory array 400 may impact one or more of the thermal relationships 430. For example, memory cells that lay on the same digit line (e.g., the aggressor memory cell 410, the first victim memory cell 415-a, and the second victim memory cell 415-b) may share a continuous liner (e.g., a sealing liner) that may act as a heat conductor. The heat conductor shared by memory cells on the same digit line 420 (e.g., a row-to-row topology or R2R) may cause memory cells that share the same digit line 420 to have a closer thermal relationship (e.g., a stronger thermal coupling between the components) than memory cells that share the same word line 425 (e.g., a column-to-column topology or C2C), where the same continuous liner may not be present. In some cases, conductive materials and/or insulative materials 455 may be intentionally positioned in the memory array 400 to affect the thermal relationships 430 between memory cells.

In some examples, the memory array 400 may have a thermal topology where the each of the victim memory cells 415 have different thermal relationships 430. The thermal relationships may be based on row-to-row topologies, column-to-column topologies, spatial imbalances between memory cells, the placement of materials that conduct thermal energy, the placement of materials that insulate components from thermal energy, or a combination thereof.

In some cases, the memory array 400 may have a thermal topology where the first thermal relationship 430-a is the closest/smallest (e.g., the thermal coupling is the greatest) due to a thermally conductive liner coupled with memory cells that share the same digit line (e.g., digit line 420-b) and the third distance 445. The second thermal relationship 430-b may larger than the first thermal relationship 430-a due to the thermally conductive liner coupled with memory cells that share the same digit line (e.g., digit line 420-b) and the fourth distance 450 being greater than the third distance 445. The third thermal relationship 430-c may be larger than the second thermal relationship 430-b due to the lack of a thermally conductive material coupling the aggressor memory cell 410 with the third victim memory cell 415-c and the first distance 435. The fourth thermal relationship 430-d may the largest thermal relationship (e.g., the least amount of thermal coupling) due to the lack of a thermally conductive material coupling the aggressor memory cell 410 with the fourth victim memory cell 415-d and the second distance 440 being greater than the third distance 445.

In some cases, the first distance 435 and the third distance 445 may be equal and/or the second distance 440 and the fourth distance 450 may be equal. Even in such situations, the thermal relationships 430 between memory cells may be different because of the presence of thermally conductive and/or thermally insulative materials between the memory cells. For example, the first thermal relationship 430-a and the third thermal relationship 430-c may be different even when the first distance 435 and the third distance 445 is equal due to differences between row-to-row topologies and column-to-column topologies (e.g., the presence of the conducive liner in the row-to-row topology). In some cases, the distances 435, 440, 445, 450 may all be different. In some case, two or more distances 435, 440, 445, 450 may be equal.

The memory array 400 illustrates one example of a thermal topology. In other examples, the memory array 400 may exhibit any number of thermal topologies by varying the distances 435, 440, 445, 450, the row-to-row topology, the column-to-column topology, the placement of thermally conductive materials, the placement of thermally insulative materials, or combinations thereof.

In one embodiment, a device or system may include a plurality of digit lines, a plurality of word lines, a neural memory unit comprising a plurality of memory cells coupled with the plurality of digit lines and the plurality of word lines, the neural memory unit configured to store an analog value, the neural memory unit comprising: a primary memory cell configured to receive a programming pulse during a write operation of the neural memory unit, and a plurality of secondary memory cells configured to be thermally coupled with the primary memory cell during the write operation, each secondary memory cell being thermally coupled with the primary memory cell according to a thermal relationship.

In some examples of the device or system described above, the thermal relationship between the primary memory cell and a first secondary memory cell of the plurality of secondary memory cells may be different than the thermal relationship between the primary memory cell and other secondary memory cells of the plurality of secondary memory cells.

In some examples of the device or system described above, the plurality of secondary memory cells may be configured to change a state based at least in part on the programming pulse being applied to the primary memory cell during the write operation. In some examples of the device or system described above, the thermal relationship may be based at least in part on a physical distance between the primary memory cell of the neural memory unit and the secondary memory cell. In some examples of the device or system described above, an insulative material positioned between the primary memory cell and at least one secondary memory cell, wherein the thermal relationship may be based at least in part on the insulative material.

In some examples of the device or system described above, the analog value stored by the neural memory unit comprises a synaptic weight that indicates a strength of a connection between two nodes. In some examples of the device or system described above, the analog value stored by the neural memory unit may be based at least in part on a resistance or a threshold voltage of the primary memory cell and each of the secondary memory cells of the neural memory unit.

In some examples of the device or system described above, each secondary memory cell of the neural memory unit changes states at a different rate when one or more programming pulses may be applied to the primary memory cell during the write operation. In some examples of the device or system described above, a rate of change of the state of each secondary memory cell may be based at least in part on the thermal relationship between each secondary memory cell and the primary memory cell.

In some examples of the device or system described above, the plurality of secondary memory cells comprises: a first secondary memory cell thermally coupled with the primary memory cell according to a first thermal relationship. In some examples of the device or system described above, a second secondary memory cell thermally coupled with the primary memory cell according to a second thermal relationship greater than the first thermal relationship. In some examples of the device or system described above, a third secondary memory cell thermally coupled with the primary memory cell according to a third thermal relationship greater than the second thermal relationship. In some examples of the device or system described above, a fourth secondary memory cell thermally coupled with the primary memory cell according to a fourth thermal relationship greater than the third thermal relationship.

In some examples of the device or system described above, the primary memory cell may be coupled with a first digit line of the plurality of digit lines and a first word line of the plurality of word lines. In some examples of the device or system described above, a first secondary memory cell and a second secondary memory cell may be coupled with the first digit line. In some examples of the device or system described above, a third secondary memory cell and a fourth secondary memory cell may be coupled with the first word line.

Some examples of the device or system described above may also include secondary memory cells of the plurality of secondary memory cells that share a digit line with the primary memory cell may have a smaller thermal relationship than secondary memory cells of the plurality of secondary memory cells that share a word line with the primary memory cell.

In some examples of the device or system described above, the thermal relationship between a first secondary memory cell of the neural memory unit and the primary memory cell may be based at least in part on a physical distance between the primary memory cell and the first secondary memory cell, a characteristic of a conductive material coupled with the primary memory cell and the first secondary memory cell, or a characteristic of an insulative material positioned between the primary memory cell and the first secondary memory cell, or a combination thereof.

In some examples of the device or system described above, the neural memory unit may be a spike-timing-dependent plasticity (STDP) unit. In some examples of the device or system described above, the plurality of memory cells each comprise a chalcogenide material.

Figure 5:
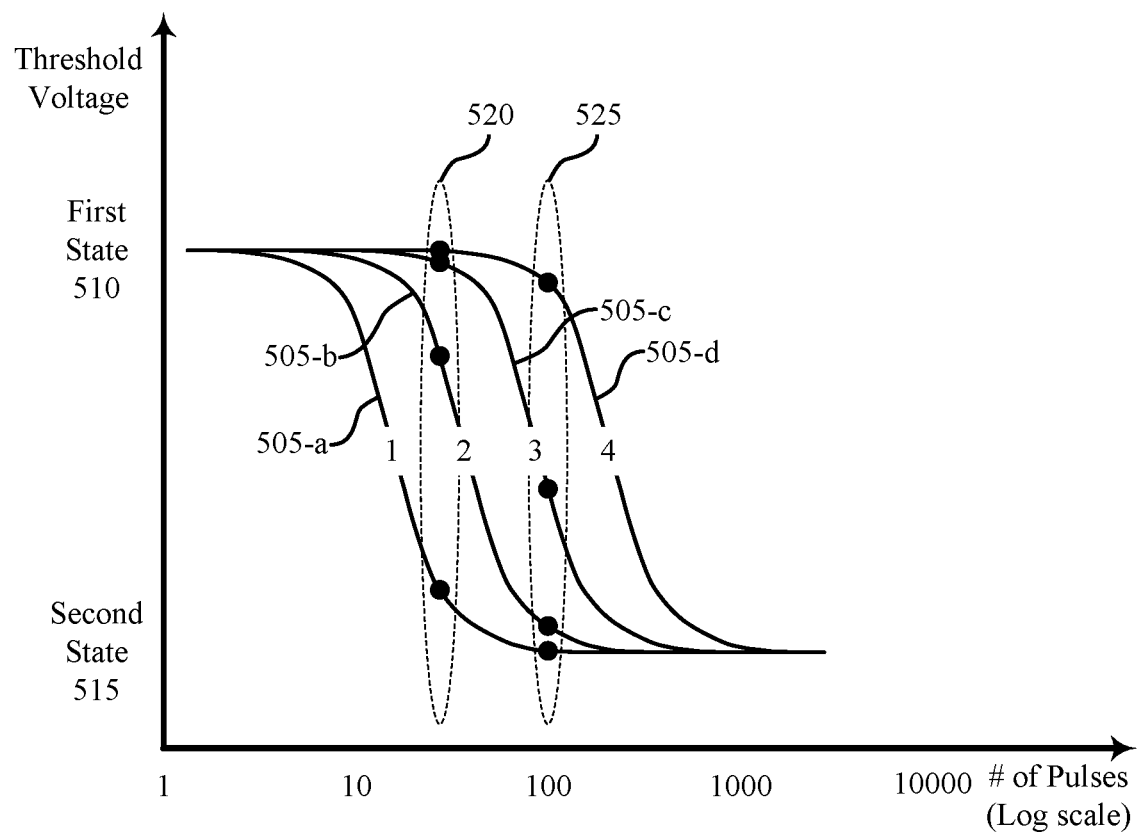
FIG. 5 illustrates an example of a diagram that shows voltage thresholds of victim memory cells during a write operation of a neural memory unit that supports weight storage using a memory device in accordance with embodiments of the present disclosure.

FIG. 5 illustrates an example of a diagram 500 that shows voltage thresholds of victim memory cells during a write operation of a neural memory unit that supports weight storage using a memory device in accordance with various embodiments of the present disclosure. The diagram 500 plots the threshold voltage of the victim memory cells on the y-axis against a number of pulses applied to an aggressor memory cell during a write operation on an x-axis. The voltage threshold on the y-axis is scaled linearly and the number of pulses on the x-axis is scaled logarithmically.

Each curve 505 in the diagram 500 may represent an individual victim memory cell of a neural memory unit (e.g., neural memory unit 305 or 405). For example, the first curve 505-a may correspond to the threshold voltage of the first victim memory cell 315-a or 415-a; the second curve 505-b may correspond to the threshold voltage of the second victim memory cell 315-b or 415-b; the third curve 505-c may correspond to the threshold voltage of the third victim memory cell 315-c or 415-c; and the fourth curve 505-d may correspond to the threshold voltage of the fourth victim memory cell 315-d or 415-d described with reference to FIGS. 3 and 4.

The value stored in the neural memory unit is based on the aggregate combination of threshold voltages of the victim memory cells in the neural memory unit. To write a value to the neural memory unit, the memory cells may first be preconditioned to a starting state and then a plurality of programming pulses may be applied to the aggressor memory cell. The plurality of programming pulses applied to aggressor memory cell may cause the victim memory cells to experience thermal disturbances. The magnitude of the thermal disturbances of each victim memory cell may be based on the thermal relationship between the aggressor memory cell and the victim memory cell and the number of pulses applied to the aggressor memory cell.

As part of a write operation, a controller (e.g., memory controller 140) may precondition the victim memory cells to a first state 510 of the victim memory cell. In some cases, the memory cells of the neural memory unit may be configured to have a first state 510 that may correspond to a reset state or an amorphous state of a chalcogenide memory cell (e.g., a phase change memory cell) and a second state 515 that may correspond to a set state or a crystalline state of a chalcogenide memory cell (e.g., a phase change memory cell). The first state 510 may be an example of a high resistive state that has a high threshold voltage, and the second state 515 may be an example of a low resistive state that has a low threshold voltage. To precondition the victim memory cells, a controller may apply a programming pulse to the victim memory cells.

As part of the write operation, the controller may apply a plurality of pulses to the aggressor memory cell. Each pulse applied to the aggressor memory cell may contribute thermal energy to the neural memory unit. The amount of thermal energy contributed may be based at least in part on the number of successive pulses that are applied to the aggressor memory cell.

The victim memory cells may experience a thermal disturbance from the thermal energy provided by applying the pulses to the aggressor memory cell during the write operation. The amount of thermal energy seen by any individual victim memory cell may vary based on the specific thermal relationship between the victim memory cell and the aggressor memory cell. For example, the first victim memory cell 415-*a* may have a closest thermal relationship 430-*a* (e.g., the strongest thermal coupling with the aggressor memory cell), and may receive more thermal energy during a write operation from the aggressor memory cell than the other victim memory cells.

The thermal energy received from a victim memory cell from applying the pulses to the aggressor memory cell may cause the victim memory cell to transition from the first state 510 to the second state 515. The write operation of the neural memory unit leverages the thermal properties of phase change memory components to store an analog value. Applying an electronic pulse to a phase change memory cell may cause the cell to change physical forms. The physical forms for some phase change memory cells include an amorphous state and a crystalline state. The resistance of these physical forms is different, thereby allowing the memory cell to store digital logic. In some PCM systems, to cause the phase change memory cell to be in an amorphous state, a controller may heat the phase change memory element with an electrical pulse and rapidly cool the phase change memory element by removing the pulse. The rapid cooling may cause the structure of the memory element to be less ordered and therefore more resistive. In some PCM systems, to cause the phase change memory cell to be in a crystalline state, a controller may heat the phase change memory element with an electrical pulse and slowly cool the phase change memory element by ramping down the electrical pulse. The slow cooling may provide time for the structure of the memory element to become more ordered and therefore less resistive. The write operation of the neural memory unit uses thermal energy from the aggressor memory cell to slowly transition the victim memory cells from the amorphous state to the crystalline state.

During the write operation, thermal energy may build in the neural memory unit based on the number of consecutive programming pulses applied to the aggressor memory cell. Victim memory cells may receive at least a portion of that thermal energy from the aggressor memory cell based on each victim memory cell's thermal relationship with the aggressor memory cell. The thermal energy may cause the phase change memory element of the victim memory cells to heat and to change states from the amorphous (e.g., reset state) to the crystalline state (e.g., set state). In this manner, the thermal energy from the aggressor memory cell may erode the threshold voltage of each victim memory cell during the write operation.

The thermal relationships of the victim memory cells may be configured such that the threshold voltage for each victim memory cell erodes at different rates. For example, the diagram 500 shows that the threshold voltage for each victim memory cell in a neural memory unit changes at a different rate for any given number of programming pulses applied to the aggressor memory cell. In some examples, the programming pulses applied to the aggressor memory cell may be reset pulses.

The analog value stored in the neural memory unit is based on the combination of the resultant threshold voltages of the victim memory cells. For example, the first circle 520 illustrates a threshold voltages for each of the victim memory cells if a first number of programming pulses are applied to the aggressor memory cell. The second circle 525 illustrates the threshold voltages for each of the victim memory cells if a second number of programming pulses are applied to the aggressor memory cell. An analog value may be based on the combination of the threshold voltages of each victim memory cell. Because the aggressor memory cell is repeatedly hit with the same programming pulses and is thus always in the same state during a read operation (e.g., a reset state), in some cases, the aggressor memory cell may not be used to store information in the neural memory unit.

The curves 505 of each victim memory cell may shifted or modified based on the thermal topology of the memory array. Different thermal relationships between the aggressor memory cell and each of the victim memory cells may cause the resultant curves to be different as well.

Figure 6:
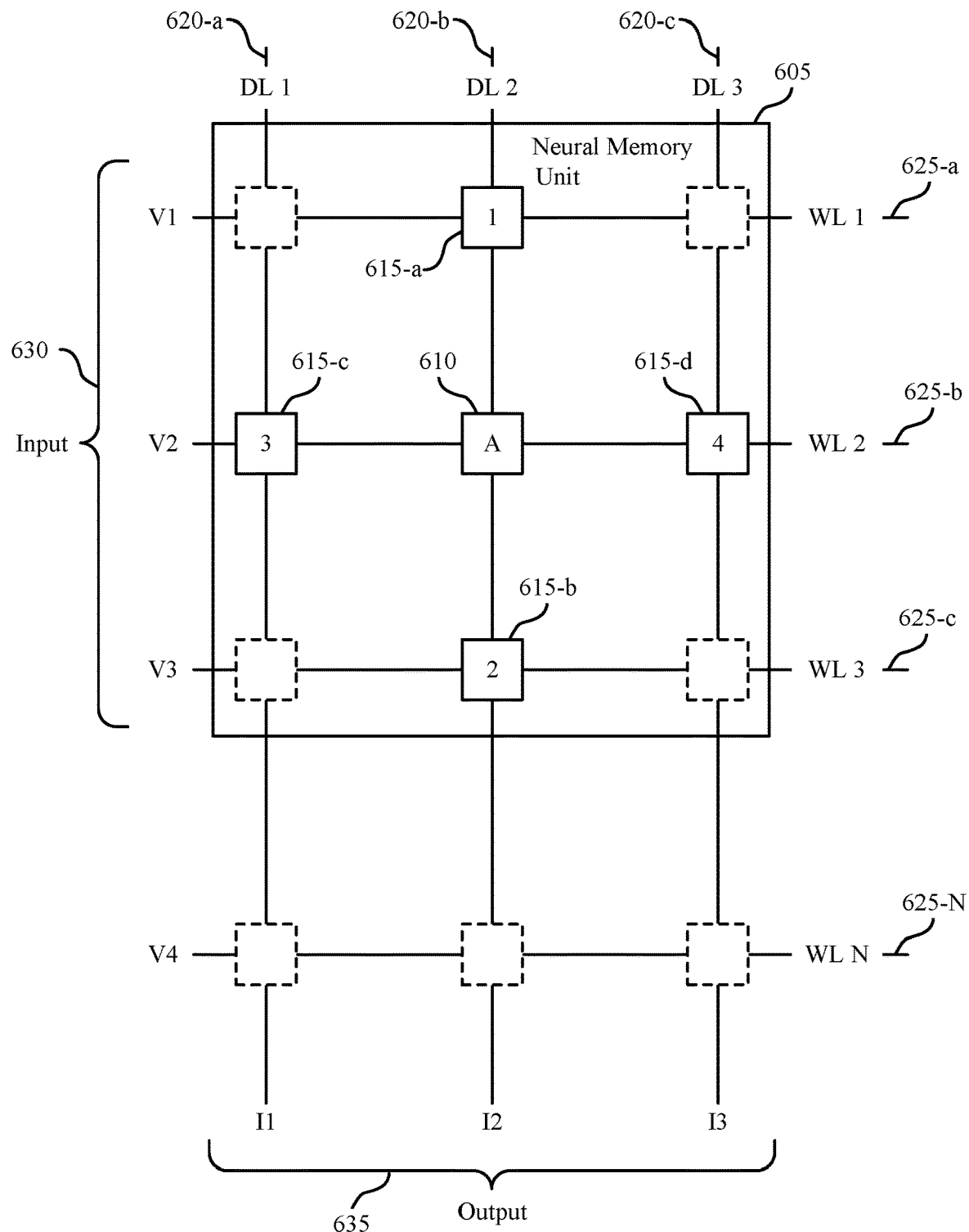
FIG. 6 illustrates an example of a memory array that shows features of read operation of a neural memory unit that supports weight storage using a memory device in accordance with embodiments of the present disclosure.

FIG. 6 illustrates an example of a memory array 600 that shows features of read operation of a neural memory unit 605 that supports weight storage using a memory device in accordance with various embodiments of the present disclosure.

The memory array 600 may be an example of the memory arrays 300 and 400 described with reference to FIGS. 3-4. The memory array 600 may include a neural memory unit 605. The neural memory unit 605 may include an aggressor memory cell 610 and a plurality of victim memory cells 615. The memory cells of the neural memory unit 605 may be coupled to a plurality of digit lines 620 and a plurality of word lines 625. Each victim memory cell 615 may have a thermal relationship with the aggressor memory cell 610. Each of these features may be examples of similar features described with reference to FIGS. 3-5 and full descriptions of these features are not repeated here. Dashed boxes may represent memory cells present in the memory array 600 but that are not part of the neural memory unit 605.

A read operation of the neural memory unit 605 may be configured to detect an analog value stored in the neural memory unit 605 by detecting weights (or threshold voltages) from the plurality of victim memory cell, and combining those weights. The analog value may be proportional to the sum of the detected weights.

A controller (e.g., memory controller 140) may select a neural memory unit 605 for a read operation. In some cases, the controller may select one or more memory cells of the neural memory unit 605 for a read operation. The controller may also identify or select one or more digit lines 620 and/or word lines 625 associated with the neural memory unit 605.

The controller may provide an input 630 to the memory cells of the neural memory unit 605. The input 630 may comprise a plurality of voltage values applied to a plurality of word lines 625 (e.g., V1, V2, V3). The controller may bias the word lines 625 to one or more voltage values (e.g., a read voltage value) included in the input 630. In some cases, the word lines 625 are all biased to the same read voltage. In some cases, the controller may bias one or more word lines to a different voltage than the other word lines.

The controller may also bias one or more unselected word lines 625-N (e.g., one or more word lines not coupled with the neural memory unit 605) to a read voltage value. In some cases, the read voltage values applied to the one or more unselected word lines 625-N are the same as the voltage values applied to the selected word lines 625-a, 625-b, 625-c. In some cases, the read voltage values applied to the one or more unselected word lines 625-N are different than at least one voltage value applied to at least one of the selected word lines 625-a, 625-b, 625-c.

The controller may detect an output 635 that includes one or more signals generated on one or more digit lines 620 coupled with the neural memory unit 605. The output 635 on the digit lines 620 may be generated based on applying the input 630 to the word lines 625 coupled with the neural memory unit 605. The signals of the output 635 may comprise current signals (e.g., I1, I2, I3). The controller may detect a leakage current associated with one or more of the digit lines 620 coupled with the neural memory unit 605.

An individual signal or an individual weight may be detected on each digit line 620 coupled with the neural memory unit 605. Each signal or weight may have different memory cells contributing to the signal. For example, the third victim memory cell 615-c may contribute to the signal on the first digit line 620-a. The fourth victim memory cell 615-d may contribute to the signal on the third digit line 620-c. The first victim memory cell 615-a and the second victim memory cell 615-b may contribute to the signal on the second digit line 620-b. In some cases, the aggressor memory cell 610 may also contribute to the signal on the second digit line 620-b, but because the state of the aggressor memory cell 610 is always the same, the contributions of the aggressor memory cell 610 may not result in detectable differences in the signal of the second digit line 620-b.

The controller may determine the analog value stored in the neural memory unit based on the detecting the signals generated on the digit lines 620 coupled with the neural memory unit. The controller may combine signals or the weights on each digit line 620 to generate a total weight. The analog value may be proportional to and/or based on the total weight. The controller may sum the signals of the digit lines 620 to generate the total weight. In some cases, the controller may generate a product by applying a weight matrix to an input vector of voltages that represent the one or more voltages on one or more word lines (e.g. V1, V2, V3). Generating the product may result in an output 635 that represents the stored analog states in the neural memory unit. In effect, the leakage currents detected during the read operation of the neural memory unit may be a product of an input vector on the one or more word lines (e.g., input 630) and the analog values stored in the memory cells of the neural memory unit. In some cases, a current on a digit line during the read operation may be a combination of multiple analog weights stored in multiple cells on the same digit line.

In some cases, the controller may precharge the memory cells of the neural memory unit 605 before biasing the word lines 625. In other cases, the memory cells of the neural memory unit 605 are not precharged. In some cases, the controller may precondition the memory cells to the first state after performing a read operation.

Figure 7:
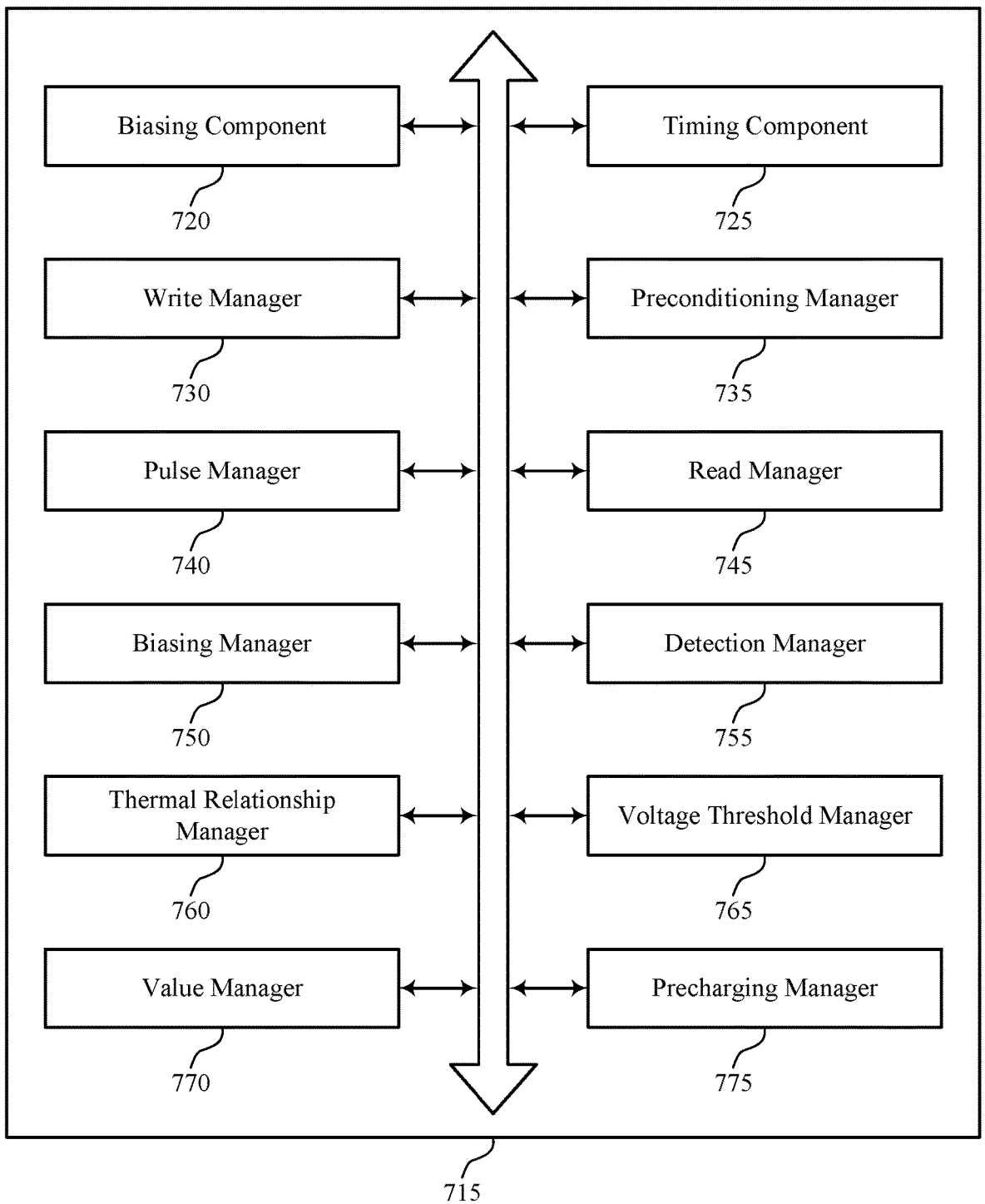
FIG. 7 shows a block diagram of a device that supports weight storage using a memory device in accordance with embodiments of the present disclosure.

FIG. 7 shows a block diagram 700 of a neural memory manager 715 that supports weight storage using a memory device in accordance with embodiments of the present disclosure. The neural memory manager 715 may be implemented or executed by a controller, such as memory controller 140 described with reference to FIG. 1. The neural memory manager 715 may include biasing component 720, timing component 725, write manager 730, preconditioning manager 735, pulse manager 740, read manager 745, biasing manager 750, detection manager 755, thermal relationship manager 760, voltage threshold manager 765, value manager 770, and precharging manager 775. Each of these components may communicate, directly or indirectly, with one another (e.g., via one or more buses).

Write manager 730 may select at least one memory cell of a neural memory unit for a write operation, the neural memory unit including a primary memory cell and a set of secondary memory cells thermally coupled with the primary memory cell and store an analog value in the neural memory unit based on applying the one or more programming pulses to the primary memory cell.

Preconditioning manager 735 may precondition the set of secondary memory cells to a memory state by applying a programming pulse to the primary memory cell and each secondary memory cell of the neural memory unit. In some cases, the primary memory cell and the set of secondary memory cells are preconditioned to a reset memory state and the programming pulse is a reset pulse. In some cases, the primary memory cell and the set of secondary memory cells are preconditioned to an amorphous memory state and the programming pulse is a reset pulse.

Pulse manager 740 may apply one or more programming pulses to the primary memory cell of the neural memory unit based on preconditioning the primary memory cell and the set of memory cells, and/or determine a number of programming pulses in the one or more programming pulses based on determining the value, where applying the one or more programming pulses to the primary memory cell is based on determining the number of programming pulses. In some cases, the one or more programming pulses applied to the primary memory cell are reset pulses and the programming pulse used to precondition the primary memory cell and the set of secondary memory cells are reset pulses. In some cases, the one or more programming pulses include a set of reset programming pulses.

Read manager 745 may select at least one memory cell of a neural memory unit for a read operation, the neural memory unit including a primary memory cell and a set of secondary memory cells thermally coupled with the primary memory cell and determine an analog value stored by the neural memory unit based on detecting the one or more signals generated on the one or more digit lines.

Biasing manager 750 may bias one or more word lines coupled with the neural memory unit based on selecting the at least one memory cell, bias an unselected word line with a voltage during the read operation, where detecting the leakage current associated with each digit line is based on biasing the unselected word line, bias a first word line of the one or more word lines during the read operation, where the first word line is coupled with at least one secondary memory cell, bias a second word line of the one or more word lines during the read operation, where the second word line is coupled with the primary memory cell and more than one secondary memory cell, and/or bias a third word line of the one or more word lines during the read operation, where the third word line is coupled with at least one secondary memory cell, where biasing the one or more word lines is based on biasing the first word line, the second word line, and the third word line.

Detection manager 755 may detect a leakage current associated with at least one digit line of the one or more digit lines, where detecting the one or more signals is based on detecting the leakage current and detect one or more signals generated on one or more digit lines coupled with the neural memory unit based on biasing the one or more word lines.

Thermal relationship manager 760 may change a state of a first secondary memory cell of the neural memory unit based on applying the one or more programming pulses to the primary memory cell and a thermal relationship between the primary memory cell and the first secondary memory cell, where the analog value stored in the neural memory unit is based on the changed state of the first secondary memory cell. In some cases, the one or more programming pulses is configured to change the memory state of each secondary memory cell based on a thermal relationship between the primary memory cell and each secondary memory cell. In some cases, each secondary memory cell being thermally coupled with the primary memory cell according to a thermal relationship. In some cases, the thermal relationship between the primary memory cell and a first secondary memory cell of the neural memory unit is different than the thermal relationship between the primary memory cell and other secondary memory cells of the neural memory unit. In some cases, each secondary memory cell is thermally coupled with the primary memory cell according to a thermal relationship. In some cases, the thermal relationship between the primary memory cell and a first secondary memory cell of the neural memory unit is different than the thermal relationship between the primary memory cell and at least one other secondary memory cell of the set of secondary memory cells.

Voltage threshold manager 765 may adjust a voltage threshold of each secondary memory cell associated with the preconditioned memory state based on applying the one or more programming pulses to the primary memory cell.

Value manager 770 may determine a value to store in the neural memory unit, determine a weight value for each signal generated on each digit line of the one or more digit lines, and combine the determined weight values for each signal generated on each digit line, where determining the analog value is based on combining the determined weight values.

Precharging manager 775 may precharge the one or more digit lines during the read operation, where detecting the one or more signals is based on precharging the one or more digit lines, precharge a second digit line of the one or more digit lines during the read operation, where the second digit line is coupled with the primary memory cell and more than one secondary memory cell, and/or precharge a third digit line of the one or more digit line during the read operation, where the third digit line is coupled with at least one secondary memory cell, where precharging the one or more digit lines is based on precharging the first digit line, the second digit line, and the third digit line. In some cases, precharging the one or more digit lines further includes: precharging a first digit line of the one or more digit lines during the read operation, where the first digit line is coupled with at least one secondary memory cell.

Figure 8:
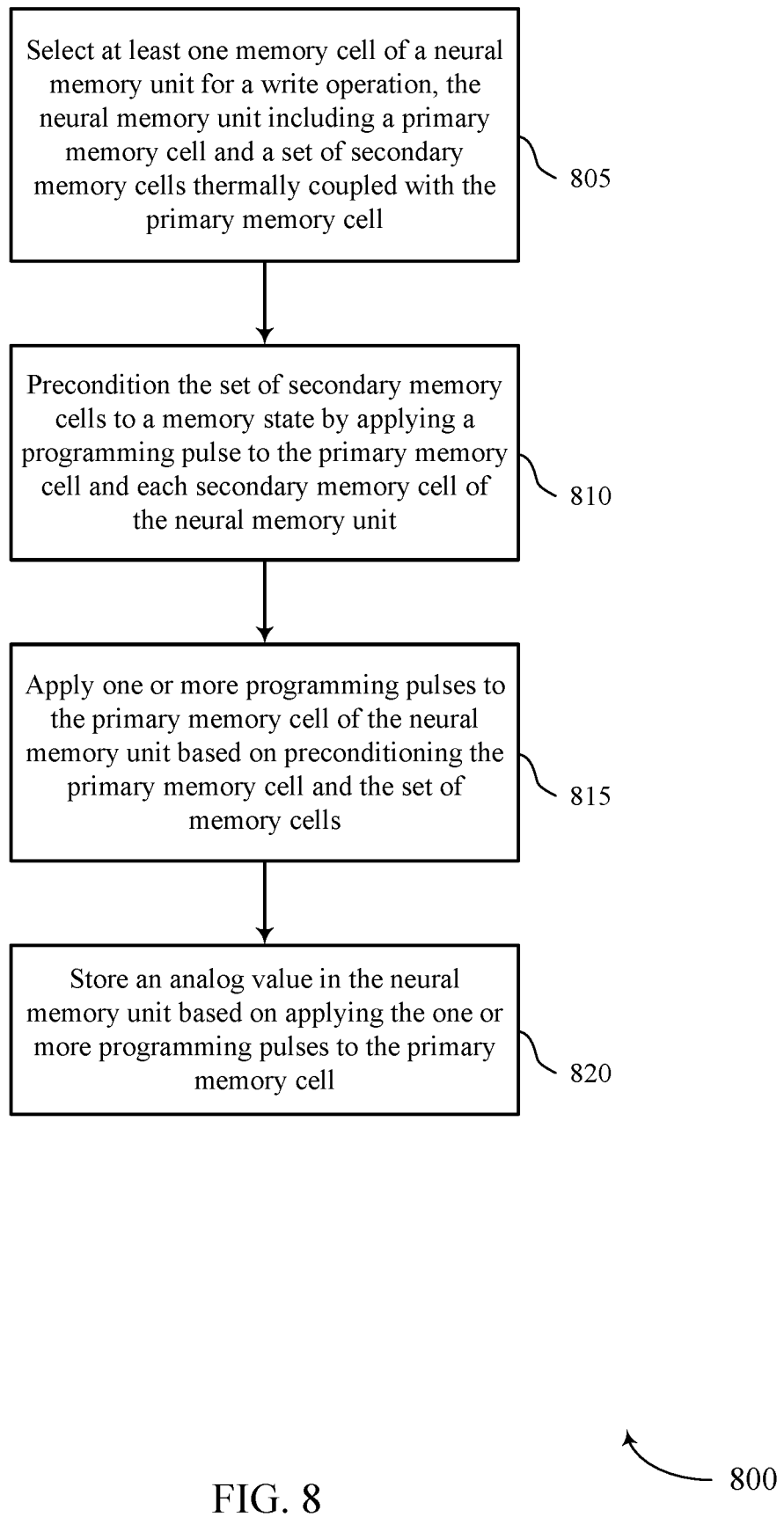
FIGS. 8 through 11 illustrate methods for weight storage using a memory device in accordance with embodiments of the present disclosure.

FIG. 8 shows a flowchart illustrating a method 800 for weight storage using a memory device in accordance with embodiments of the present disclosure. The operations of method 800 may be implemented by a controller 140 or its components as described herein. For example, the operations of method 800 may be performed by a neural memory manager as described with reference to FIG. 7. In some examples, a controller 140 may execute a set of codes to control the functional elements of the device to perform the functions described below. Additionally or alternatively, the controller 140 may perform aspects of the functions described below using special-purpose hardware.

At 805 the controller 140 may select at least one memory cell of a neural memory unit for a write operation, the neural memory unit comprising a primary memory cell and a plurality of secondary memory cells thermally coupled with the primary memory cell. The operations of 805 may be performed according to the methods described herein. In certain examples, aspects of the operations of 805 may be performed by a write manager as described with reference to FIG. 7.

At 810 the controller 140 may precondition the plurality of secondary memory cells to a memory state by applying a programming pulse to the primary memory cell and each secondary memory cell of the neural memory unit. The operations of 810 may be performed according to the methods described herein. In certain examples, aspects of the operations of 810 may be performed by a preconditioning manager as described with reference to FIG. 7.

At 815 the controller 140 may apply one or more programming pulses to the primary memory cell of the neural memory unit based at least in part on preconditioning the primary memory cell and the plurality of memory cells. The operations of 815 may be performed according to the methods described herein. In certain examples, aspects of the operations of 815 may be performed by a pulse manager as described with reference to FIG. 7.

At 820 the controller 140 may store an analog value in the neural memory unit based at least in part on applying the one or more programming pulses to the primary memory cell. The operations of 820 may be performed according to the methods described herein. In certain examples, aspects of the operations of 820 may be performed by a write manager as described with reference to FIG. 7.

An apparatus for performing the method 800 is described. The apparatus may include means for selecting at least one memory cell of a neural memory unit for a write operation, the neural memory unit comprising a primary memory cell and a plurality of secondary memory cells thermally coupled with the primary memory cell, means for preconditioning the plurality of secondary memory cells to a memory state by applying a programming pulse to the primary memory cell and each secondary memory cell of the neural memory unit, means for applying one or more programming pulses to the primary memory cell of the neural memory unit based at least in part on preconditioning the primary memory cell and the plurality of memory cells, and means for storing an analog value in the neural memory unit based at least in part on applying the one or more programming pulses to the primary memory cell.

Another apparatus for performing the method 800 is described. The apparatus may include a memory cell and a memory controller in electronic communication with the memory cell, wherein the memory cell is operable to select at least one memory cell of a neural memory unit for a write operation, the neural memory unit comprising a primary memory cell and a plurality of secondary memory cells thermally coupled with the primary memory cell, precondition the plurality of secondary memory cells to a memory state by applying a programming pulse to the primary memory cell and each secondary memory cell of the neural memory unit, apply one or more programming pulses to the primary memory cell of the neural memory unit based at least in part on preconditioning the primary memory cell and the plurality of memory cells, and store an analog value in the neural memory unit based at least in part on applying the one or more programming pulses to the primary memory cell.

Some examples of the method and apparatus described above may further include processes, features, means, or instructions for changing a state of a first secondary memory cell of the neural memory unit based at least in part on applying the one or more programming pulses to the primary memory cell and a thermal relationship between the primary memory cell and the first secondary memory cell, wherein the analog value stored in the neural memory unit may be based at least in part on the changed state of the first secondary memory cell.

In some examples of the method and apparatus described above, the one or more programming pulses may be configured to change the memory state of each secondary memory cell based at least in part on a thermal relationship between the primary memory cell and each secondary memory cell.

Some examples of the method and apparatus described above may further include processes, features, means, or instructions for adjusting a voltage threshold of each secondary memory cell associated with the preconditioned memory state based at least in part on applying the one or more programming pulses to the primary memory cell.

Some examples of the method and apparatus described above may further include processes, features, means, or instructions for determining a value to store in the neural memory unit. Some examples of the method and apparatus described above may further include processes, features, means, or instructions for determining a number of programming pulses in the one or more programming pulses based at least in part on determining the value, wherein applying the one or more programming pulses to the primary memory cell may be based at least in part on determining the number of programming pulses.

In some examples of the method and apparatus described above, the one or more programming pulses applied to the primary memory cell may be reset pulses and the programming pulse used to precondition the primary memory cell and the plurality of secondary memory cells may be reset pulses. In some examples of the method and apparatus described above, the primary memory cell and the plurality of secondary memory cells may be preconditioned to a reset memory state and the programming pulse may be a reset pulse. In some examples of the method and apparatus described above, the primary memory cell and the plurality of secondary memory cells may be preconditioned to an amorphous memory state and the programming pulse may be a reset pulse. In some examples of the method and apparatus described above, the one or more programming pulses comprise a plurality of reset programming pulses.

In some examples of the method and apparatus described above, each secondary memory cell being thermally coupled with the primary memory cell according to a thermal relationship. In some examples of the method and apparatus described above, the thermal relationship between the primary memory cell and a first secondary memory cell of the neural memory unit may be different than the thermal relationship between the primary memory cell and other secondary memory cells of the neural memory unit.

Figure 9:
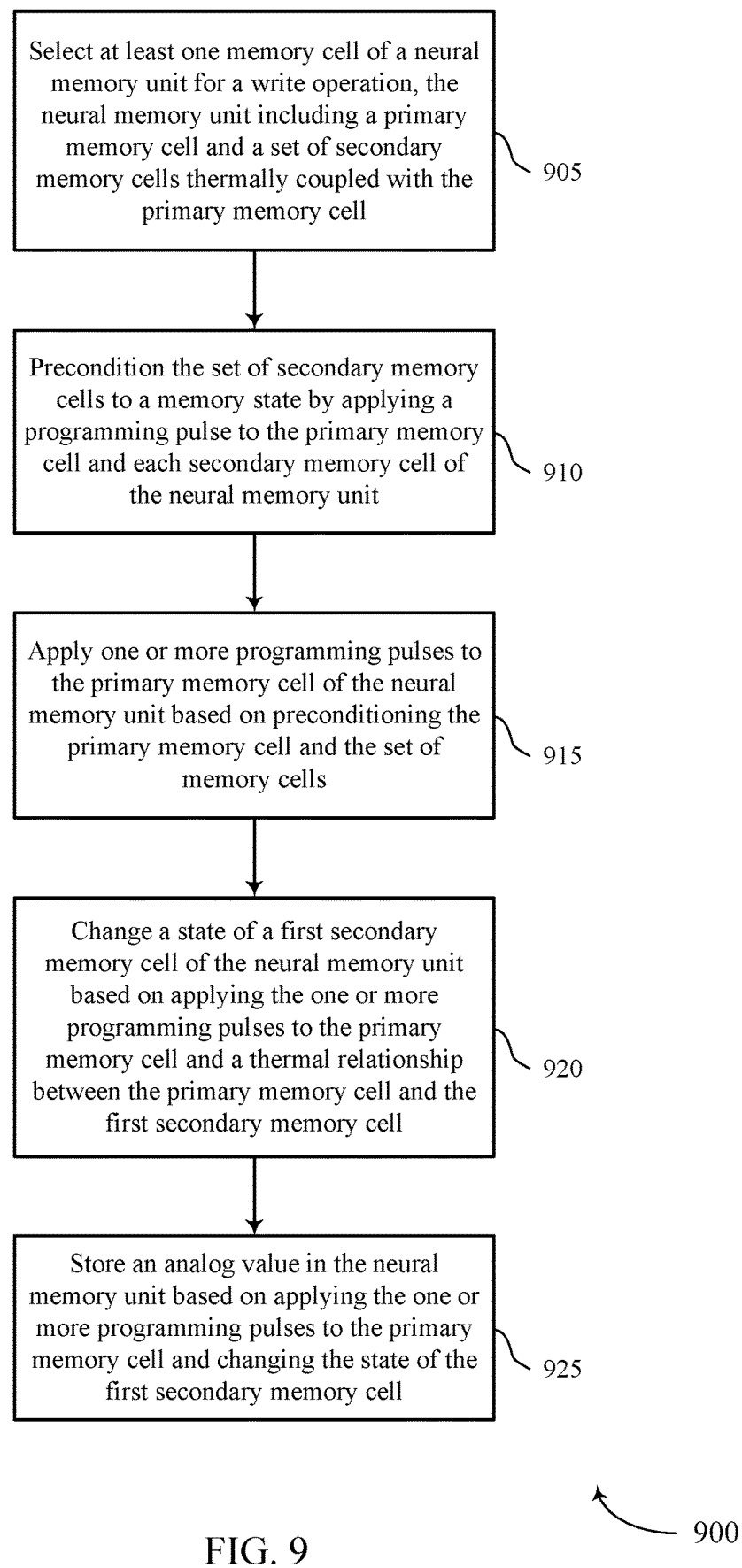

FIG. 9 shows a flowchart illustrating a method 900 for weight storage using a memory device in accordance with embodiments of the present disclosure. The operations of method 900 may be implemented by a controller 140 or its components as described herein. For example, the operations of method 900 may be performed by a neural memory manager as described with reference to FIG. 7. In some examples, a controller 140 may execute a set of codes to control the functional elements of the device to perform the functions described below. Additionally or alternatively, the controller 140 may perform aspects of the functions described below using special-purpose hardware.

At 905 the controller 140 may select at least one memory cell of a neural memory unit for a write operation, the neural memory unit comprising a primary memory cell and a plurality of secondary memory cells thermally coupled with the primary memory cell. The operations of 905 may be performed according to the methods described herein. In certain examples, aspects of the operations of 905 may be performed by a write manager as described with reference to FIG. 7.

At 910 the controller 140 may precondition the plurality of secondary memory cells to a memory state by applying a programming pulse to the primary memory cell and each secondary memory cell of the neural memory unit. The operations of 910 may be performed according to the methods described herein. In certain examples, aspects of the operations of 910 may be performed by a preconditioning manager as described with reference to FIG. 7.

At 915 the controller 140 may apply one or more programming pulses to the primary memory cell of the neural memory unit based at least in part on preconditioning the primary memory cell and the plurality of memory cells. The operations of 915 may be performed according to the methods described herein. In certain examples, aspects of the operations of 915 may be performed by a pulse manager as described with reference to FIG. 7.

At 920 the controller 140 may change a state of a first secondary memory cell of the neural memory unit based at least in part on applying the one or more programming pulses to the primary memory cell and a thermal relationship between the primary memory cell and the first secondary memory cell. The operations of 920 may be performed according to the methods described herein. In certain examples, aspects of the operations of 920 may be performed by a thermal relationship manager as described with reference to FIG. 7.

At 925 the controller 140 may store an analog value in the neural memory unit based at least in part on applying the one or more programming pulses to the primary memory cell and changing the state of the first secondary memory cell. The operations of 925 may be performed according to the methods described herein. In certain examples, aspects of the operations of 925 may be performed by a write manager as described with reference to FIG. 7.

Figure 10:
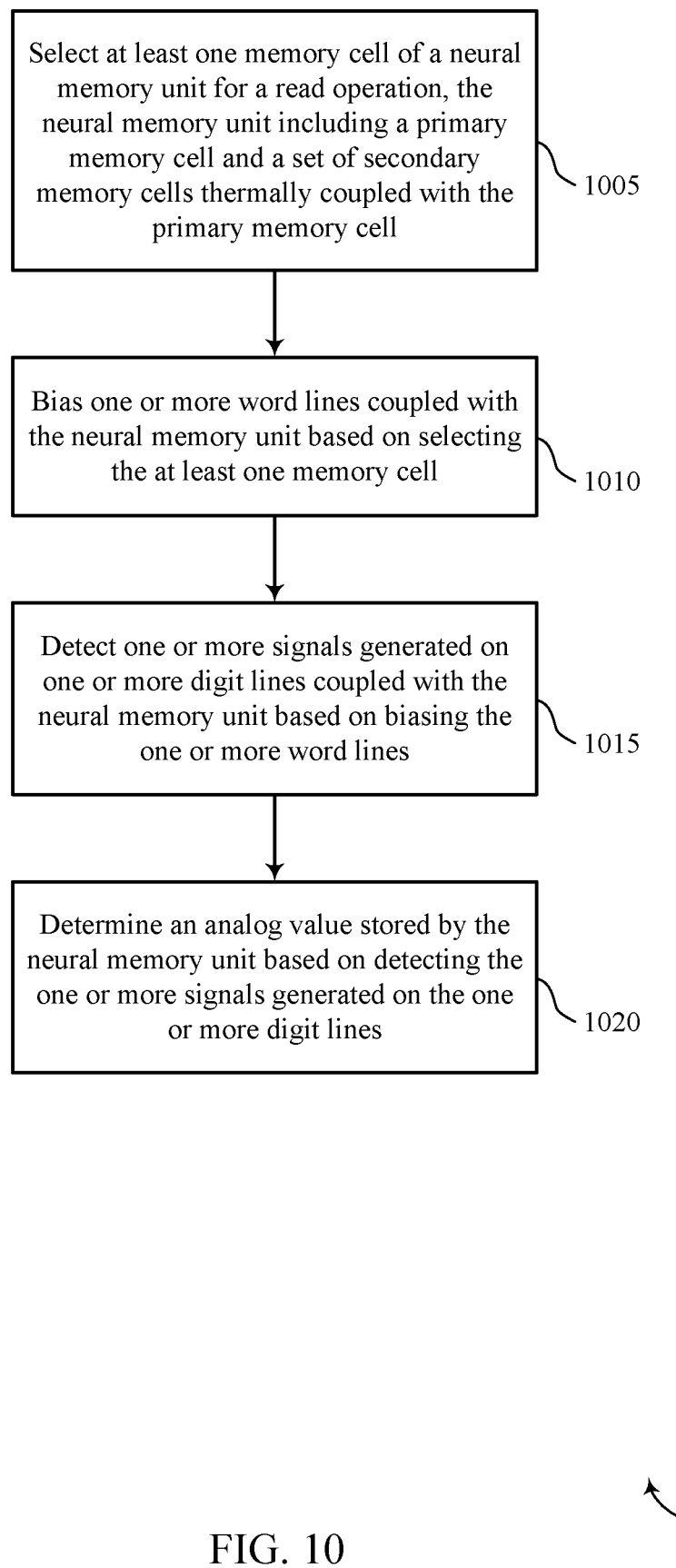

FIG. 10 shows a flowchart illustrating a method 1000 for weight storage using a memory device in accordance with embodiments of the present disclosure. The operations of method 1000 may be implemented by a controller 140 or its components as described herein. For example, the operations of method 1000 may be performed by a neural memory manager as described with reference to FIG. 7. In some examples, a controller 140 may execute a set of codes to control the functional elements of the device to perform the functions described below. Additionally or alternatively, the controller 140 may perform aspects of the functions described below using special-purpose hardware.

At 1005 the controller 140 may select at least one memory cell of a neural memory unit for a read operation, the neural memory unit comprising a primary memory cell and a plurality of secondary memory cells thermally coupled with the primary memory cell. The operations of 1005 may be performed according to the methods described herein. In certain examples, aspects of the operations of 1005 may be performed by a read manager as described with reference to FIG. 7.

At 1010 the controller 140 may bias one or more word lines coupled with the neural memory unit based at least in part on selecting the at least one memory cell. The operations of 1010 may be performed according to the methods described herein. In certain examples, aspects of the operations of 1010 may be performed by a biasing manager as described with reference to FIG. 7.

At 1015 the controller 140 may detect one or more signals generated on one or more digit lines coupled with the neural memory unit based at least in part on biasing the one or more word lines. The operations of 1015 may be performed according to the methods described herein. In certain examples, aspects of the operations of 1015 may be performed by a detection manager as described with reference to FIG. 7.

At 1020 the controller 140 may determine an analog value stored by the neural memory unit based at least in part on detecting the one or more signals generated on the one or more digit lines. The operations of 1020 may be performed according to the methods described herein. In certain examples, aspects of the operations of 1020 may be performed by a read manager as described with reference to FIG. 7.

An apparatus for performing the method 1000 is described. The apparatus may include means for selecting at least one memory cell of a neural memory unit for a read operation, the neural memory unit comprising a primary memory cell and a plurality of secondary memory cells thermally coupled with the primary memory cell, means for biasing one or more word lines coupled with the neural memory unit based at least in part on selecting the at least one memory cell, means for detecting one or more signals generated on one or more digit lines coupled with the neural memory unit based at least in part on biasing the one or more word lines, and means for determining an analog value stored by the neural memory unit based at least in part on detecting the one or more signals generated on the one or more digit lines.

Another apparatus for performing the method 1000 is described. The apparatus may include a memory cell and a memory controller in electronic communication with the memory cell, wherein the memory cell is operable to select at least one memory cell of a neural memory unit for a read operation, the neural memory unit comprising a primary memory cell and a plurality of secondary memory cells thermally coupled with the primary memory cell, bias one or more word lines coupled with the neural memory unit based at least in part on selecting the at least one memory cell, detect one or more signals generated on one or more digit lines coupled with the neural memory unit based at least in part on biasing the one or more word lines, and determine an analog value stored by the neural memory unit based at least in part on detecting the one or more signals generated on the one or more digit lines.

Some examples of the method and apparatus described above may further include processes, features, means, or instructions for detecting a leakage current associated with at least one digit line of the one or more digit lines, wherein detecting the one or more signals may be based at least in part on detecting the leakage current.

Some examples of the method and apparatus described above may further include processes, features, means, or instructions for biasing an unselected word line with a voltage during the read operation, wherein detecting the leakage current associated with each digit line may be based at least in part on biasing the unselected word line.

Some examples of the method and apparatus described above may further include processes, features, means, or instructions for determining a weight value for each signal generated on each digit line of the one or more digit lines. Some examples of the method and apparatus described above may further include processes, features, means, or instructions for combining the determined weight values for each signal generated on each digit line, wherein determining the analog value may be based at least in part on combining the determined weight values.

Some examples of the method and apparatus described above may further include processes, features, means, or instructions for precharging the one or more digit lines during the read operation, wherein detecting the one or more signals may be based at least in part on precharging the one or more digit lines.

In some examples of the method and apparatus described above, precharging the one or more digit lines further comprises: precharging a first digit line of the one or more digit lines during the read operation, wherein the first digit line may be coupled with at least one secondary memory cell. Some examples of the method and apparatus described above may further include processes, features, means, or instructions for precharging a second digit line of the one or more digit lines during the read operation, wherein the second digit line may be coupled with the primary memory cell and more than one secondary memory cell. Some examples of the method and apparatus described above may further include processes, features, means, or instructions for precharging a third digit line of the one or more digit line during the read operation, wherein the third digit line may be coupled with at least one secondary memory cell, wherein precharging the one or more digit lines may be based at least in part on precharging the first digit line, the second digit line, and the third digit line.

Some examples of the method and apparatus described above may further include processes, features, means, or instructions for biasing a first word line of the one or more word lines during the read operation, wherein the first word line may be coupled with at least one secondary memory cell. Some examples of the method and apparatus described above may further include processes, features, means, or instructions for biasing a second word line of the one or more word lines during the read operation, wherein the second word line may be coupled with the primary memory cell and more than one secondary memory cell. Some examples of the method and apparatus described above may further include processes, features, means, or instructions for biasing a third word line of the one or more word lines during the read operation, wherein the third word line may be coupled with at least one secondary memory cell, wherein biasing the one or more word lines may be based at least in part on biasing the first word line, the second word line, and the third word line.

In some examples of the method and apparatus described above, each secondary memory cell may be thermally coupled with the primary memory cell according to a thermal relationship. In some examples of the method and apparatus described above, the thermal relationship between the primary memory cell and a first secondary memory cell of the neural memory unit may be different than the thermal relationship between the primary memory cell and at least one other secondary memory cell of the plurality of secondary memory cells.

Figure 11:
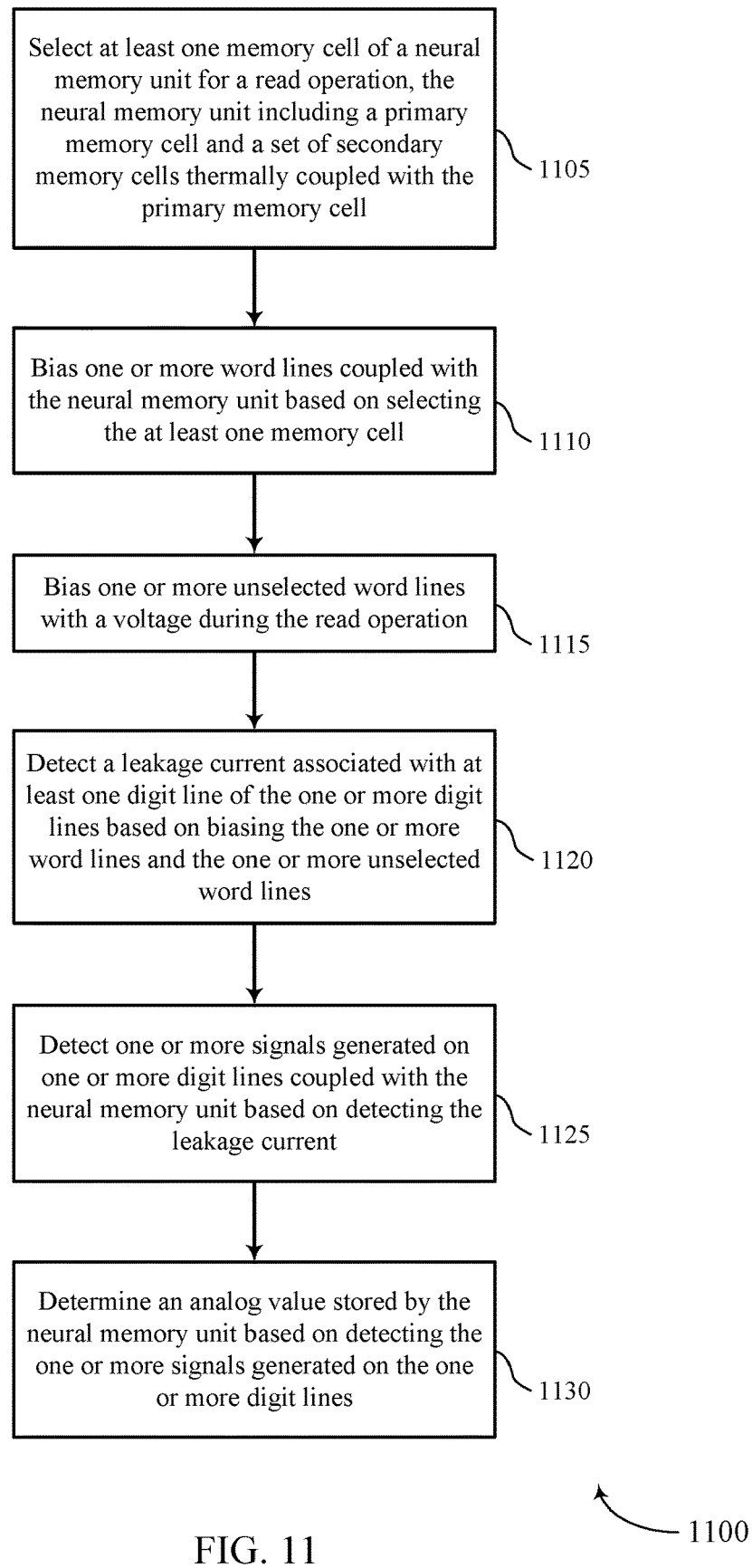

FIG. 11 shows a flowchart illustrating a method 1100 for weight storage using a memory device in accordance with embodiments of the present disclosure. The operations of method 1100 may be implemented by a controller 140 or its components as described herein. For example, the operations of method 1100 may be performed by a neural memory manager as described with reference to FIG. 7. In some examples, a controller 140 may execute a set of codes to control the functional elements of the device to perform the functions described below. Additionally or alternatively, the controller 140 may perform aspects of the functions described below using special-purpose hardware.

At 1105 the controller 140 may select at least one memory cell of a neural memory unit for a read operation, the neural memory unit including a primary memory cell and a set of secondary memory cells thermally coupled with the primary memory cell. The operations of 1105 may be performed according to the methods described herein. In certain examples, aspects of the operations of 1105 may be performed by a read manager as described with reference to FIG. 7.

At 1110 the controller 140 may bias one or more word lines coupled with the neural memory unit based on selecting the at least one memory cell. The operations of 1110 may be performed according to the methods described herein. In certain examples, aspects of the operations of 1110 may be performed by a biasing manager as described with reference to FIG. 7.

At 1115 the controller 140 may bias one or more unselected word lines with a voltage during the read operation. The operations of 1115 may be performed according to the methods described herein. In certain examples, aspects of the operations of 1115 may be performed by a biasing manager as described with reference to FIG. 7.

At 1120 the controller 140 may detect a leakage current associated with at least one digit line of the one or more digit lines based on biasing the one or more word lines and the one or more unselected word lines. The operations of 1120 may be performed according to the methods described herein. In certain examples, aspects of the operations of 1120 may be performed by a detection manager as described with reference to FIG. 7.

At 1125 the controller 140 may detect one or more signals generated on one or more digit lines coupled with the neural memory unit based on detecting the leakage current. The operations of 1125 may be performed according to the methods described herein. In certain examples, aspects of the operations of 1125 may be performed by a detection manager as described with reference to FIG. 7.

At 1130 the controller 140 may determine an analog value stored by the neural memory unit based at least in part on detecting the one or more signals generated on the one or more digit lines. The operations of 1130 may be performed according to the methods described herein. In certain examples, aspects of the operations of 1130 may be performed by a read manager as described with reference to FIG. 7.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components.

Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory device, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:
1. A device, comprising:
   a plurality of digit lines;
   a plurality of word lines;

a neural memory unit comprising a plurality of memory cells coupled with the plurality of digit lines and the plurality of word lines, the neural memory unit configured to store an analog value, the neural memory unit comprising: a primary memory cell configured to receive a programming pulse during a write operation of the neural memory unit; and a plurality of secondary memory cells configured to be thermally coupled with the primary memory cell during the write operation, each secondary memory cell being thermally coupled with the primary memory cell according to a thermal relationship, wherein the analog value stored in the neural memory unit is based at least in part on each thermal relationship between the plurality of secondary memory cells and the primary cell.

2. The device of claim 1, wherein the thermal relationship between the primary memory cell and a first secondary memory cell of the plurality of secondary memory cells is different than the thermal relationship between the primary memory cell and other secondary memory cells of the plurality of secondary memory cells.

3. The device of claim 1, wherein the plurality of secondary memory cells are configured to change a state based at least in part on the programming pulse being applied to the primary memory cell during the write operation.

4. The device of claim 1, wherein the thermal relationship is based at least in part on a physical distance between the primary memory cell of the neural memory unit and the secondary memory cell.

5. The device of claim 1, wherein an insulative material is positioned between the primary memory cell and at least one secondary memory cell, wherein the thermal relationship is based at least in part on the insulative material.

6. The device of claim 1, wherein the analog value stored by the neural memory unit comprises a synaptic weight that indicates a strength of a connection between two nodes.

7. The device of claim 1, wherein the analog value stored by the neural memory unit is based at least in part on a resistance or a threshold voltage of the primary memory cell and each of the secondary memory cells of the neural memory unit.

8. The device of claim 1, wherein:
each secondary memory cell of the neural memory unit changes states at a different rate when one or more programming pulses are applied to the primary memory cell during the write operation; and a rate of change of a state of each secondary memory cell is based at least in part on the thermal relationship between each secondary memory cell and the primary memory cell.

9. The device of claim 1, wherein:
the plurality of secondary memory cells comprise:
a first secondary memory cell thermally coupled with the primary memory cell according to a first thermal relationship;
a second secondary memory cell thermally coupled with the primary memory cell according to a second thermal relationship greater than the first thermal relationship;
a third secondary memory cell thermally coupled with the primary memory cell according to a third thermal relationship greater than the second thermal relationship; and
a fourth secondary memory cell thermally coupled with the primary memory cell according to a fourth thermal relationship greater than the third thermal relationship.

10. The device of claim 1, wherein:
the primary memory cell is coupled with a first digit line of the plurality of digit lines and a first word line of the plurality of word lines;
a first secondary memory cell and a second secondary memory cell are coupled with the first digit line; and
a third secondary memory cell and a fourth secondary memory cell are coupled with the first word line.

11. The device of claim 1, further comprising:
secondary memory cells of the plurality of secondary memory cells that share a digit line with the primary memory cell have a smaller thermal relationship than secondary memory cells of the plurality of secondary memory cells that share a word line with the primary memory cell.

12. The device of claim 1, wherein the thermal relationship between a first secondary memory cell of the neural memory unit and the primary memory cell is based at least in part on a physical distance between the primary memory cell and the first secondary memory cell, a characteristic of a conductive material coupled with the primary memory cell and the first secondary memory cell, or a characteristic of an insulative material positioned between the primary memory cell and the first secondary memory cell, or a combination thereof.

13. The device of claim 1, wherein the neural memory unit is a spike-timing-dependent plasticity (STDP) unit.

14. The device of claim 1, wherein the plurality of memory cells each comprise a chalcogenide material.

* * * * *